United States Patent
Chang et al.

(10) Patent No.: US 10,084,465 B2
(45) Date of Patent: Sep. 25, 2018

(54) ANALOG-TO-DIGITAL CONVERTERS WITH A PLURALITY OF COMPARATORS

(71) Applicant: SK hynix Inc., Icheon-si, Gyeonggi-do (KR)

(72) Inventors: Keunjin Chang, Icheon-si (KR); Joo Won Oh, Seoul (KR); Donghoon Sung, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/651,694

(22) Filed: Jul. 17, 2017

(65) Prior Publication Data

US 2018/0175876 A1 Jun. 21, 2018

(30) Foreign Application Priority Data

Dec. 21, 2016 (KR) ........................ 10-2016-0175755

(51) Int. Cl.
*H03M 1/12* (2006.01)

(52) U.S. Cl.
CPC ....... *H03M 1/1245* (2013.01); *H03M 1/1205* (2013.01)

(58) Field of Classification Search
CPC .......................... H03M 1/1245; H03M 1/1205
USPC ................................ 341/122, 155, 135, 160
See application file for complete search history.

(56) References Cited

U.S. PATENT DOCUMENTS

| | | | | |
|---|---|---|---|---|
| 2005/0280475 | A1* | 12/2005 | Hanselmann | H03L 7/0898 331/16 |
| 2006/0164278 | A1* | 7/2006 | Suzuki | H03M 1/002 341/155 |
| 2009/0058469 | A1* | 3/2009 | Hiller | H03F 3/45273 327/56 |
| 2010/0321227 | A1* | 12/2010 | Hales | G01R 19/257 341/158 |
| 2013/0106469 | A1* | 5/2013 | Slavov | H03K 17/063 327/109 |

FOREIGN PATENT DOCUMENTS

| KR | 100174499 B1 | 4/1999 |
|---|---|---|
| KR | 1020140079095 A | 6/2014 |

* cited by examiner

*Primary Examiner* — Peguy Jean Pierre
(74) *Attorney, Agent, or Firm* — William Park & Associates Ltd.

(57) ABSTRACT

An analog-to-digital converter ADC may be provided. The ADC may include a current driving circuit. The current driving circuit may include an additive current driving circuit and a subtractive current driving circuit configured for adjusting a voltage level of a node. The ADC may include a comparison circuit including a plurality of comparators. Each of the plurality of comparators may be configured to compare a voltage level of the node with a reference voltage.

22 Claims, 35 Drawing Sheets

US 10,084,465 B2

ANALOG-TO-DIGITAL CONVERTERS WITH A PLURALITY OF COMPARATORS

CROSS-REFERENCE TO RELATED APPLICATIONS

The present application claims priority under 35 U.S.C 119(a) to Korean Application No. 10-2016-0175755, filed on Dec. 21, 2016, which is herein incorporated by references in its entirety.

BACKGROUND

1. Technical Field

Various embodiments of the present disclosure may generally relate to analog-to-digital converters and, more particularly, to current steering analog-to-digital converters.

2. Related Art

Analog-to-digital converters (ADCs) are typical circuits of digital hybrid mode systems that convert an analog signal into a digital signal. The ADCs have been used as main components of interfacing circuits in application areas of communication systems, fast image processing systems, or the like. Generally, in order to realize fast and high resolution ADCs, a technique using a most significant bit (MSB) corresponding to a high-order bit and a least significant bit (LSB) corresponding to a low-order bit which are separated from each other may be employed as a current steering technique utilizing high performance current sources and switches.

SUMMARY

According to an embodiment, an analog-to-digital converter ADC may be provided. The analog-to-digital converter may include a current driving circuit. The current driving circuit may include an additive current driving circuit and a subtractive current driving circuit configured for adjusting a voltage level of a node. The ADC may include a comparison circuit including a plurality of comparators. Each of the plurality of comparators may be configured to compare a voltage level of the node with a reference voltage.

DETAILED DESCRIPTION

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments may be directed to current steering analog-to-digital converters.

Figure 1:
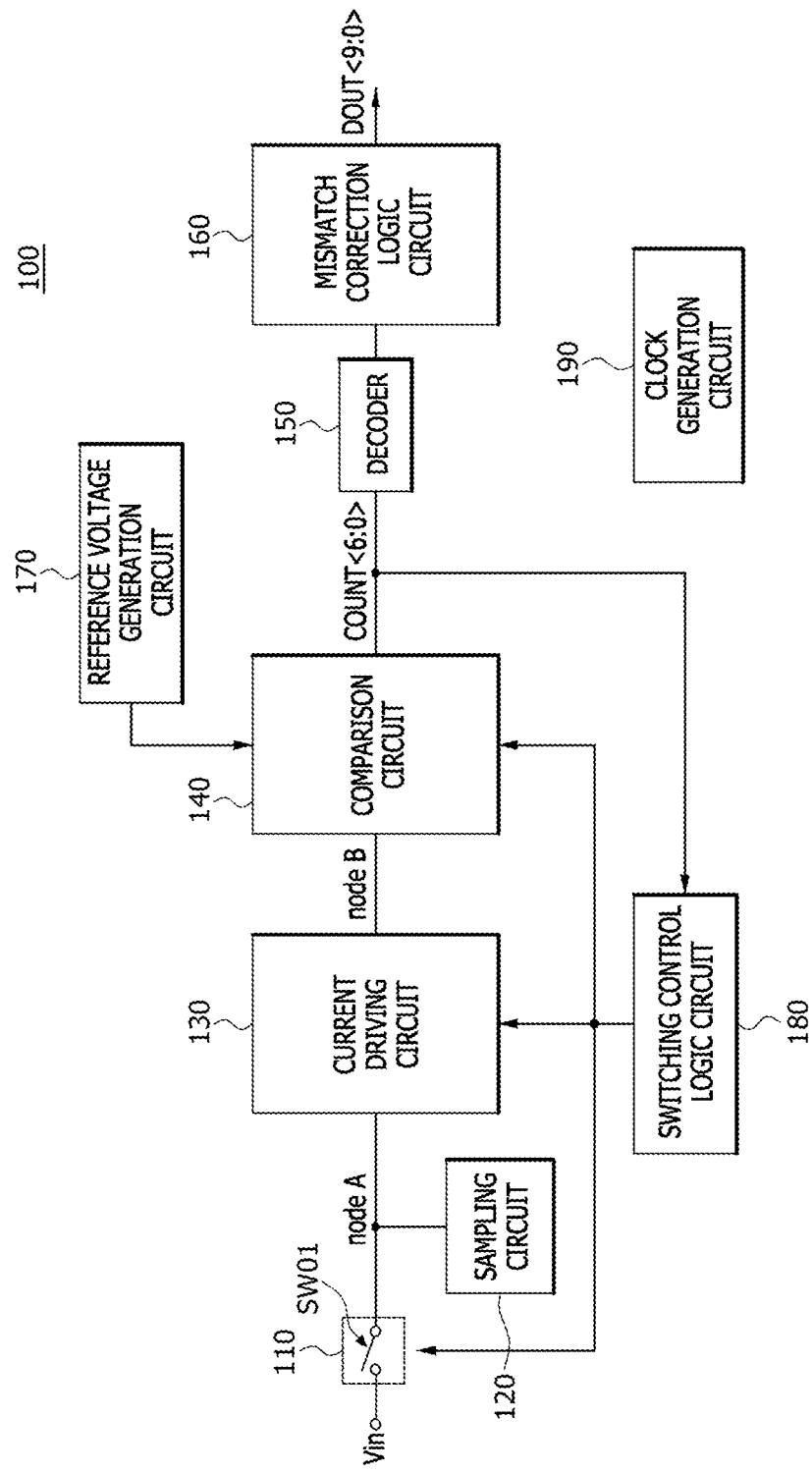
FIG. 1 is a block diagram illustrating a current steering analog-to-digital converter according to an embodiment of the present disclosure.
Figure 2:
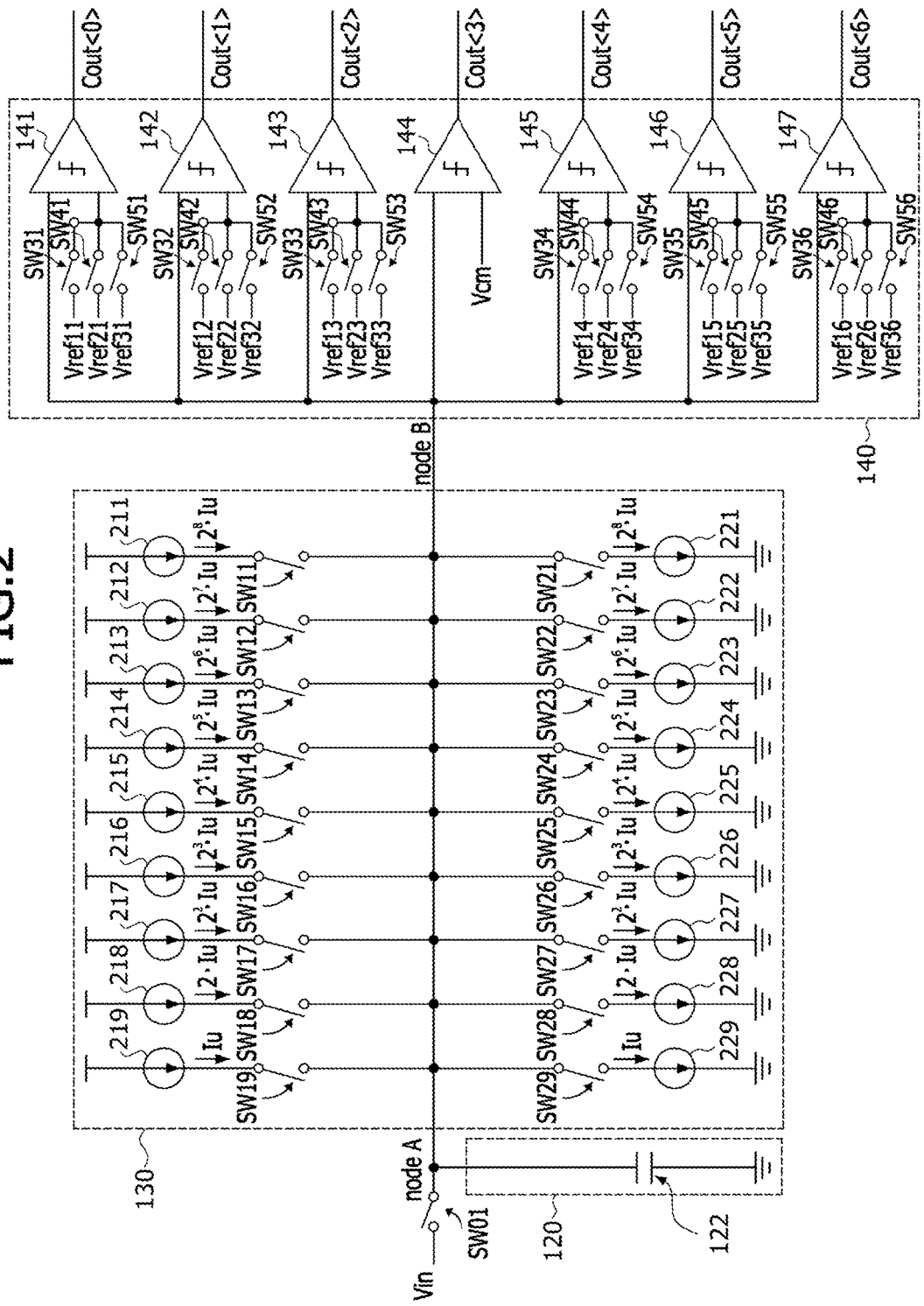
FIG. 2 is a circuit diagram illustrating a sampling circuit, a current driving circuit and a comparison circuit included in the current steering analog-to-digital converter illustrated in FIG. 1.
Figure 3:
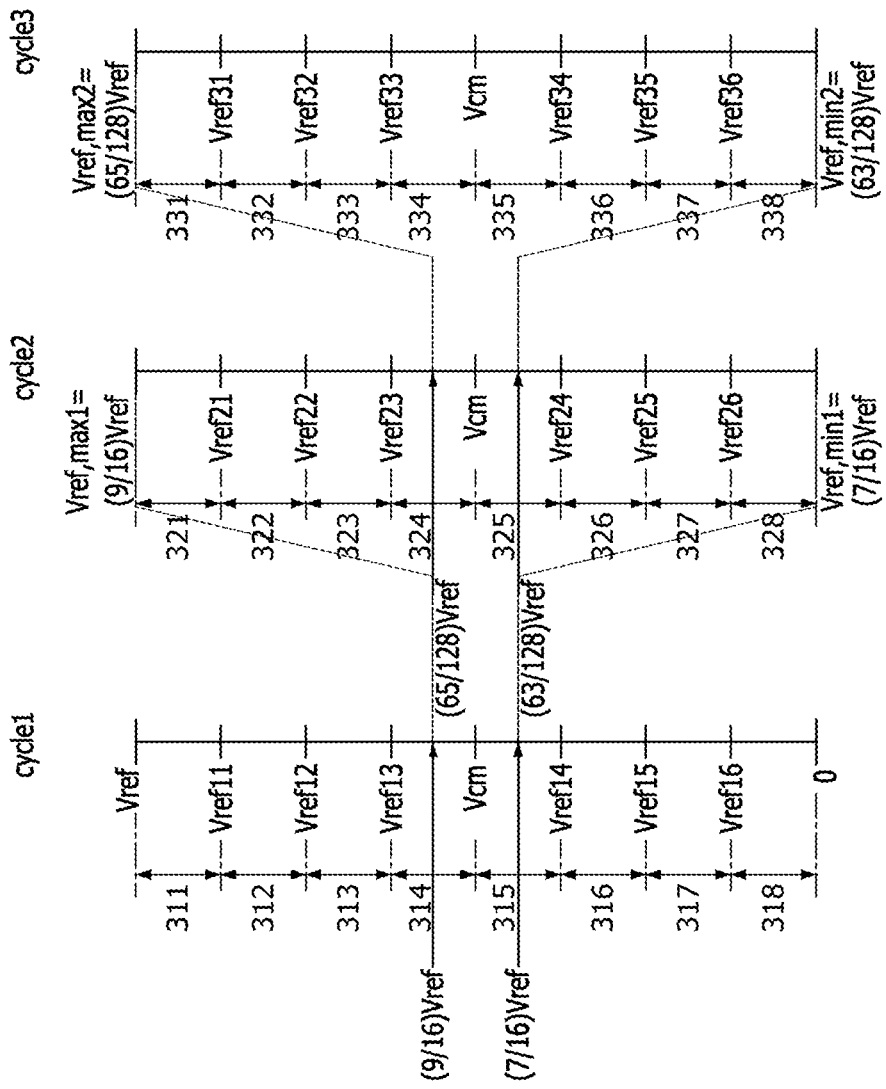
FIG. 3 illustrates relationships between reference voltages applied to first to seventh comparators of the comparison circuit and binary output data outputted from the first to seventh comparators of the comparison circuit, in units of clock cycles.

FIG. 1 is a block diagram illustrating a current steering analog-to-digital converter 100 according to an embodiment of the present disclosure. FIG. 2 is a circuit diagram illustrating a sampling circuit, a current driving circuit and a comparison circuit included in the current steering analog-to-digital converter 100 illustrated in FIG. 1. FIG. 3 illustrates relationships between reference voltages applied to first to seventh comparators of the comparison circuit and binary output data outputted from the first to seventh comparators of the comparison circuit, in units of clock cycles. The following embodiments will be described in conjunction with an example in which an input voltage signal Vin corresponding to an analog signal is converted into a digital output signal having ten bits. However, the embodiments are not limited in this manner and more or less than ten bits may be used. Referring to FIGS. 1 and 2, the current steering analog-to-digital converter 100 may be configured to include a sampling switch circuit 110, a sampling circuit 120, a current driving circuit 130, a comparison circuit 140, a decoder 150, a mismatch correction logic circuit 160, a reference voltage generation circuit 170, a switching control logic circuit 180 and a clock generation circuit 190. In an embodiment, the current steering analog-to-digital converter 100 may be realized without the mismatch correction logic circuit 160. According to the current steering analog-to-digital converter 100, a current steering technique may be employed in the analog-to-digital converter 100 to reduce a size of a sampling capacitor and a plurality of comparators may be disposed in the comparison circuit 140 to reduce the number of cycles of a clock signal which is used while an analog-to-digital converting operation is performed.

The sampling switch circuit 110 may be realized using a sampling switch SW01 coupled between an input terminal receiving the input voltage signal Vin and a node NODE_A.

If the sampling switch SW01 is turned on, the input voltage signal Vin applied to the node NODE_A may be sampled by the sampling circuit 120. If the input voltage signal Vin is sampled by the sampling circuit 120, the sampling switch SW01 may be turned off until a current steering analog-to-digital converting operation terminates. The on/off operation of the sampling switch SW01 may be controlled by the switching control logic circuit 180.

The sampling circuit 120 may perform a sampling operation of the input voltage signal Vin using a charge integration technique. The sampling circuit 120 may include a sampling capacitor 122 coupled between the node NODE_A and a ground voltage terminal. During a sampling step that the sampling switch SW01 is turned on, the sampling capacitor 122 may be charged by the input voltage signal Vin applied to the node NODE_A. If the sampling capacitor 122 is fully charged and the sampling switch SW01 is turned off, the sampling capacitor 122 may be discharged through the node NODE_A so that an amount of charges in the sampling capacitor 122 are reduced.

The current driving circuit 130 may increase or reduce an amount of charges supplied by the sampling capacitor 122 through the node NODE_A to generate and output a voltage signal through a node NODE_B. The node NODE_A and the node NODE_B may correspond to an input node and an output node of the current driving circuit 130, respectively. The current driving circuit 130 may include an additive current driving circuit coupled between a power supply voltage terminal and the node NODE_B and a subtractive current driving circuit coupled between the node NODE_B and the ground voltage terminal. The additive current driving circuit may increase a voltage (hereinafter, referred to as an input node voltage) at the node NODE_A by a predetermined voltage. That is, a voltage (hereinafter, referred to as an output node voltage) at the node NODE_B may be increased by the additive current driving circuit. The subtractive current driving circuit may lower the input node voltage at the node NODE_A by a predetermined voltage. That is, the output node voltage at the node NODE_B may be lowered by the subtractive current driving circuit. The additive current driving circuit may include a plurality of additive current steering sources (e.g., first to ninth additive current steering sources 211~219) which are coupled in parallel between the power supply voltage terminal and the node NODE_B. The additive current steering sources 211~219 may supply currents that flow from the power supply voltage terminal toward the node NODE_B. The subtractive current driving circuit may include a plurality of subtractive current steering sources (e.g., first to ninth subtractive current steering sources 221~229) which are coupled in parallel between the node NODE_B and the ground voltage terminal. The subtractive current steering sources 221~229 may supply currents that flow from the node NODE_B toward the ground voltage terminal.

Each of the additive current steering sources 211~219 and the subtractive current steering sources 221~229 may supply a weighted current. For example, each of the first additive current steering source 211 and the first subtractive current steering source 221 may provide a current having an amount of "$2^8 \times Iu$" (where, "Iu" denotes a unit current), and each of the second additive current steering source 212 and the second subtractive current steering source 222 may provide a current having an amount of "$2^7 \times Iu$". In addition, each of the third additive current steering source 213 and the third subtractive current steering source 223 may provide a current having an amount of "$2^6 \times Iu$", and each of the fourth additive current steering source 214 and the fourth subtractive current steering source 224 may provide a current having an amount of "$2^5 \times Iu$". Moreover, each of the fifth additive current steering source 215 and the fifth subtractive current steering source 225 may provide a current having an amount of "$2^4 \times Iu$", and each of the sixth additive current steering source 216 and the sixth subtractive current steering source 226 may provide a current having an amount of "$2^3 \times Iu$". Further, each of the seventh additive current steering source 217 and the seventh subtractive current steering source 227 may provide a current having an amount of "$2^2 \times Iu$", and each of the eighth additive current steering source 218 and the eighth subtractive current steering source 228 may provide a current having an amount of "$2 \times Iu$". Furthermore, each of the ninth additive current steering source 219 and the ninth subtractive current steering source 229 may provide a current having an amount of "Iu".

A plurality of additive switches, for example, first to ninth additive switches SW11~SW19 may be coupled between the additive current steering sources 211~219 and the node NODE_B, respectively. For example, the first additive switch SW11 may be coupled between the first additive current steering source 211 and the node NODE_B, and the second additive switch SW12 may be coupled between the second additive current steering source 212 and the node NODE_B. In addition, the third additive switch SW13 may be coupled between the third additive current steering source 213 and the node NODE_B, and the fourth additive switch SW14 may be coupled between the fourth additive current steering source 214 and the node NODE_B. Moreover, the fifth additive switch SW15 may be coupled between the fifth additive current steering source 215 and the node NODE_B, and the sixth additive switch SW16 may be coupled between the sixth additive current steering source 216 and the node NODE_B. Further, the seventh additive switch SW17 may be coupled between the seventh additive current steering source 217 and the node NODE_B, and the eighth additive switch SW18 may be coupled between the eighth additive current steering source 218 and the node NODE_B. Furthermore, the ninth additive switch SW19 may be coupled between the ninth additive current steering source 219 and the node NODE_B.

A plurality of subtractive switches, for example, first to ninth subtractive switches SW21~SW29 may be coupled between the node NODE_B and the subtractive current steering sources 221~229, respectively. For example, the first subtractive switch SW21 may be coupled between the node NODE_B and the first subtractive current steering source 221, and the second subtractive switch SW22 may be coupled between the node NODE_B and the second subtractive current steering source 222. In addition, the third subtractive switch SW23 may be coupled between the node NODE_B and the third subtractive current steering source 223, and the fourth subtractive switch SW24 may be coupled between the node NODE_B and the fourth subtractive current steering source 224. Moreover, the fifth subtractive switch SW25 may be coupled between the node NODE_B and the fifth subtractive current steering source 225, and the sixth subtractive switch SW26 may be coupled between the node NODE_B and the sixth subtractive current steering source 226. Further, the seventh subtractive switch SW27 may be coupled between the node NODE_B and the seventh subtractive current steering source 227, and the eighth subtractive switch SW28 may be coupled between the node NODE_B and the eighth subtractive current steering source 228. Furthermore, the ninth subtractive switch SW29 may be coupled between the node NODE_B and the ninth subtractive current steering source 229.

If the eighth and ninth additive switches SW18 and SW19 are turned on, an output node voltage VnodeB1 at the node NODE_B may have a voltage level corresponding to a sum of an input node voltage VnodeA induced at the input node NODE_A and voltages generated due to currents provided by the eighth and ninth additive current steering sources 218 and 219 and may be expressed by the following equation 1. If the eighth and ninth subtractive switches SW28 and SW29 are turned on, an output node voltage VnodeB2 at the node NODE_B may have a voltage level that remains after subtracting voltages generated due to currents provided by the eighth and ninth subtractive current steering sources 228 and 229 from the input node voltage VnodeA induced at the input node NODE_A and may be expressed by the following equation 2.

$$VnodeB1 = VnodeA + (t \times 2Iu/Cs) + (t \times Iu/Cs) \quad \text{(Equation 1)}$$

$$VnodeB2 = VnodeA - (t \times 2Iu/Cs) - (t \times Iu/Cs) \quad \text{(Equation 2)}$$

In the equations 1 and 2, "t" denotes a time period during which currents outputted from the eighth and ninth additive current steering sources 218 and 219 or the eighth and ninth subtractive current steering sources 228 and 229 flow through the node NODE_B, and "Cs" denotes a capacitance value of the sampling capacitor 122. That is, if at least one of the first to ninth additive current steering sources 211~219 is electrically connected to the node NODE_B during a predetermined time period, the output node voltage at the node NODE_B may increase by a voltage generated due to the at least one additive current steering source electrically connected to the node NODE_B. If at least one of the first to ninth subtractive current steering sources 221~229 is electrically connected to the node NODE_B during a predetermined time period, the output node voltage at the node NODE_B may become lowered by a voltage generated due to the at least one subtractive current steering source electrically connected to the node NODE_B. Switching operations of the first to ninth additive switches SW11~SW19 and the first to ninth subtractive switches SW21~SW29 may be controlled by the switching control logic circuit 180.

The comparison circuit 140 may compare the output node voltage induced at the node NODE_B with reference voltages to generate comparison output data Cout<0:6>. The comparison output data Cout<0:6> may be inputted to the decoder 150 and the switching control logic circuit 180. The comparison circuit 140 may include a plurality of comparators, for example, first to seventh comparators 141~147. The first to third comparators 141, 142 and 143 may correspond to high-order comparators, and the fifth to seventh comparators 145, 146 and 147 may correspond to low-order comparators. The fourth comparator 144 may correspond to a middle comparator disposed between a group of the high-order comparators 141, 142 and 143 and a group of the low-order comparators 145, 146 and 147. In such a case, the group of the high-order comparators 141, 142 and 143 and the group of the low-order comparators 145, 146 and 147 may be disposed to be symmetric with respect to the middle comparator 144. Each of the first to seventh comparators 141~147 may have a first input terminal and a second input terminal. The first input terminals of the first to seventh comparators 141~147 may be electrically coupled to the node NODE_B in common. Thus, the output node voltage induced at the node NODE_B may be applied to the first to seventh comparators 141~147 through the first input terminals of the first to seventh comparators 141~147. A reference mid-voltage Vcm may be applied to the second input terminal of the fourth comparator 144. Each of the second input terminals of the first to third comparators 141, 142 and 143 and the fifth to seventh comparators 145, 146 and 147 may receive any one of three reference voltages. Each of the second input terminals of the first to third comparators 141, 142 and 143 and the fifth to seventh comparators 145, 146 and 147 may receive any one of three reference voltages through one of three switches.

Each of the first to third comparators 141, 142 and 143 and the fifth to seventh comparators 145, 146 and 147 may compare the output node voltage inputted through the first input terminal with the reference voltage inputted through the second input terminal to output a binary datum having a logic "high(1)" level if the output node voltage is higher than the reference voltage and to output a binary datum having a logic "low(0)" level if the output node voltage is lower than the reference voltage. Similarly, the fourth comparator 144 may compare the output node voltage inputted through the first input terminal with the reference mid-voltage Vcm inputted through the second input terminal to output a binary datum having a logic "high(1)" level if the output node voltage is higher than the reference mid-voltage Vcm and to output a binary datum having a logic "low(0)" level if the output node voltage is lower than the reference mid-voltage Vcm. Accordingly, the comparison output data Cout<0:6> outputted from the first to seventh comparators 141~147 may correspond to seven-bit binary data.

The second input terminal of the first comparator 141 may receive a first reference voltage Vref11 of a first group of reference voltages through a first switch SW31 of a first group of switches, a first reference voltage Vref21 of a second group of reference voltages through a first switch SW41 of a second group of switches, or a first reference voltage Vref31 of a third group of reference voltages through a first switch SW51 of a third group of switches. The second input terminal of the second comparator 142 may receive a second reference voltage Vref12 of the first group of reference voltages through a second switch SW32 of the first group of switches, a second reference voltage Vref22 of the second group of reference voltages through a second switch SW42 of the second group of switches, or a second reference voltage Vref32 of the third group of reference voltages through a second switch SW52 of the third group of switches. The second input terminal of the third comparator 143 may receive a third reference voltage Vref13 of the first group of reference voltages through a third switch SW33 of the first group of switches, a third reference voltage Vref23 of the second group of reference voltages through a third switch SW43 of the second group of switches, or a third reference voltage Vref33 of the third group of reference voltages through a third switch SW53 of the third group of switches.

The second input terminal of the fifth comparator 145 may receive a fourth reference voltage Vref14 of the first group of reference voltages through a fourth switch SW34 of the first group of switches, a fourth reference voltage Vref24 of the second group of reference voltages through a fourth switch SW44 of the second group of switches, or a fourth reference voltage Vref34 of the third group of reference voltages through a fourth switch SW54 of the third group of switches. The second input terminal of the sixth comparator 146 may receive a fifth reference voltage Vref15 of the first group of reference voltages through a fifth switch SW35 of the first group of switches, a fifth reference voltage Vref25 of the second group of reference voltages through a fifth switch SW45 of the second group of switches, or a fifth reference voltage Vref35 of the third group of reference voltages through a fifth switch SW55 of the third group of switches. The second input terminal of the seventh comparator 147 may receive a sixth reference voltage Vref16 of the first group of reference voltages through a sixth switch SW36 of the first group of switches, a sixth reference voltage Vref26 of the second group of reference voltages through a sixth switch SW46 of the second group of switches, or a sixth reference voltage Vref36 of the third group of reference voltages through a sixth switch SW56 of the third group of switches.

Operations of the first to seventh comparators 141~147 may be performed in clock cycles. During a first clock cycle CYCLE1, the first to sixth switches SW31~SW36 included in the first group of switches are turned on, and the first to sixth switches SW41~SW46 and the first to sixth switches SW51~SW56 included in the second and third groups of switches are turned off. In such a case, the comparison circuit 140 may generate the comparison output data corresponding to data of the first bit (i.e., an MSB) to the third bit of the ten-bit digital output signal. During a second clock cycle CYCLE2, the first to sixth switches SW41~SW46 included in the second group of switches are turned on, and the first to sixth switches SW31~SW36 and the first to sixth switches SW51~SW56 included in the first and third groups of switches are turned off. In such a case, the comparison circuit 140 may generate the comparison output data corresponding to data of the fourth bit to the sixth bit of the ten-bit digital output signal. During a third clock cycle CYCLE3, the first to sixth switches SW51~SW56 included in the third group of switches are turned on, and the first to sixth switches SW31~SW36 and the first to sixth switches SW41~SW46 included in the first and second groups of switches are turned off. In such a case, the comparison circuit 140 may generate the comparison output data corresponding to data of the seventh bit to the tenth bit (i.e., an LSB) of the ten-bit digital output signal.

As the first to sixth switches SW31~SW36 included in the first group of switches are selectively turned on during the first clock cycle CYCLE1, the first to third reference voltages Vref11~Vref13 included in the first group of reference voltages, the reference mid-voltage Vcm, and the fourth to sixth reference voltages Vref14~Vref16 included in the first group of reference voltages may be used as the reference voltages of the first to seventh comparators 141~147, respectively (see FIG. 3). In an embodiment, the first to third reference voltages Vref11, Vref12 and Vref13 included in the first group of reference voltages, the reference mid-voltage Vcm, and the fourth to sixth reference voltages Vref14, Vref15 and Vref16 included in the first group of reference voltages may have voltage levels for equally dividing a voltage between a maximum reference voltage Vref and the ground voltage into eight sections during the first clock cycle CYCLE1. In such a case, the first reference voltage Vref11 may have a highest voltage level among the first to sixth reference voltages Vref11~Vref16 and the reference mid-voltage Vcm, and the sixth reference voltage Vref16 may have a lowest voltage level among the first to sixth reference voltages Vref11~Vref16 and the reference mid-voltage Vcm. The reference mid-voltage Vcm may have a middle voltage level between the first reference voltage Vref11 and the sixth reference voltage Vref16. The maximum reference voltage Vref may be determined according to a range of the input voltage signal Vin of the analog-to-digital converter 100. In an embodiment, the first reference voltage Vref11 among the first group of reference voltages may have a voltage level of "(7/8)×Vref", the second reference voltage Vref12 among the first group of reference voltages may have a voltage level of "(6/8)×Vref", the third reference voltage Vref13 among the first group of reference voltages may have a voltage level of "(5/8)×Vref", the reference mid-voltage Vcm may have a voltage level of "(4/8)×Vref", the fourth reference voltage Vref14 among the first group of reference voltages may have a voltage level of "(3/8)×Vref", the fifth reference voltage Vref15 among the first group of reference voltages may have a voltage level of "(2/8)×Vref", and the sixth reference voltage Vref16 among the first group of reference voltages may have a voltage level of "(1/8)×Vref".

In the first clock cycle CYCLE1, there may be eight-number of first voltage sections 311~318 between the maximum reference voltage Vref and the ground voltage, which are equally divided by the first to third reference voltages Vref11~Vref13, the reference mid-voltage Vcm, and the fourth to sixth reference voltages Vref14~Vref16. The first voltage section 311 between the maximum reference voltage Vref and the first reference voltage Vref11 may correspond to a case that the output node voltage inputted to the first input terminals of the first to seventh comparators 141~147 is higher than the first to third reference voltages Vref11~Vref13, the reference mid-voltage Vcm, and the fourth to sixth reference voltages Vref14~Vref16 which are inputted to the second input terminals of the first to seventh comparators 141~147. In such a case, the comparison output data <6:0> outputted from the first to seventh comparators 141~147 may have a logic level combination of '1111111'. The first voltage section 312 between the first reference voltage Vref11 and the second reference voltage Vref12 may correspond to a case that the output node voltage inputted to the first input terminals of the first to seventh comparators 141~147 is lower than the first reference voltage Vref11 inputted to the second input terminal of the first comparator 141 and is higher than the second to sixth reference voltages Vref12~Vref16 and the reference mid-voltage Vcm which are inputted to the second input terminals of the second to seventh comparators 142~147. In such a case, the comparison output data Cout<0:6> outputted from the first to seventh comparators 141~147 may have a logic level combination of '0111111'.

The first voltage section 313 between the second reference voltage Vref12 and the third reference voltage Vref13 may correspond to a case that the output node voltage inputted to the first input terminals of the first to seventh comparators 141~147 is lower than the first and second reference voltages Vref11 and Vref12 inputted to the second input terminals of the first and second comparators 141 and 142 and is higher than the third to sixth reference voltages Vref13~Vref16 and the reference mid-voltage Vcm which are inputted to the second input terminals of the third to seventh comparators 143~147. In such a case, the comparison output data Cout<0:6> outputted from the first to seventh comparators 141~147 may have a logic level combination of '0011111'. The first voltage section 314 between the third reference voltage Vref13 and the reference mid-voltage Vcm may correspond to a case that the output node voltage inputted to the first input terminals of the first to seventh comparators 141~147 is lower than the first to third reference voltages Vref11~Vref13 inputted to the second input terminals of the first to third comparators 141~143 and is higher than the reference mid-voltage Vcm and the fourth to sixth reference voltages Vref14~Vref16 which are inputted to the second input terminals of the fourth to seventh comparators 144~147. In such a case, the comparison output data Cout<0:6> outputted from the first to seventh comparators 141~147 may have a logic level combination of '0001111'.

The first voltage section 315 between the reference mid-voltage Vcm and the fourth reference voltage Vref14 may correspond to a case that the output node voltage inputted to the first input terminals of the first to seventh comparators 141~147 is lower than the first to third reference voltages Vref11~Vref13 and the reference mid-voltage Vcm which are inputted to the second input terminals of the first to fourth comparators 141~144 and is higher than the fourth to sixth reference voltages Vref14~Vref16 which are inputted to the second input terminals of the fifth to seventh comparators 145~147. In such a case, the comparison output data Cout<0:6> outputted from the first to seventh comparators 141~147 may have a logic level combination of '0000111'. The first voltage section 316 between the fourth reference voltage Vref14 and the fifth reference voltage Vref15 may correspond to a case that the output node voltage inputted to the first input terminals of the first to seventh comparators 141~147 is lower than the first to fourth reference voltages Vref11~Vref14 and the reference mid-voltage Vcm which are inputted to the second input terminals of the first to fourth comparators 141~145 and is higher than the fifth and sixth reference voltages Vref15 and Vref16 which are inputted to the second input terminals of the sixth and seventh comparators 146~147. In such a case, the comparison output data Cout<0:6> outputted from the first to seventh comparators 141~147 may have a logic level combination of '0000011'.

The first voltage section 317 between the fifth reference voltage Vref15 and the sixth reference voltage Vref16 may correspond to a case that the output node voltage inputted to the first input terminals of the first to seventh comparators 141~147 is lower than the first to fifth reference voltages Vref11~Vref15 and the reference mid-voltage Vcm which are inputted to the second input terminals of the first to sixth comparators 141~146 and is higher than the sixth reference voltage Vref16 which is inputted to the second input terminal of the seventh comparator 147. In such a case, the comparison output data Cout<0:6> outputted from the first to seventh comparators 141~147 may have a logic level combination of '0000001'. The first voltage section 318 between the sixth reference voltage Vref16 and the ground voltage may correspond to a case that the output node voltage inputted to the first input terminals of the first to seventh comparators 141~147 is lower than the first to sixth reference voltages Vref11~Vref16 and the reference mid-voltage Vcm which are inputted to the second input terminals of the first to seventh comparators 141~147 and is higher than the ground voltage. In such a case, the comparison output data Cout<0:6> outputted from the first to seventh comparators 141~147 may have a logic level combination of '0000000'.

As the first to sixth switches SW41~SW46 included in the second group of switches are selectively turned on during the second clock cycle CYCLE2, the first to third reference voltages Vref21~Vref23 included in the second group of reference voltages, the reference mid-voltage Vcm, and the fourth to sixth reference voltages Vref24~Vref26 included in the second group of reference voltages may be used as the reference voltages of the first to seventh comparators 141~147, respectively (see FIG. 3). In an embodiment, the first to third reference voltages Vref21, Vref22 and Vref23 included in the second group of reference voltages, the reference mid-voltage Vcm, and the fourth to sixth reference voltages Vref24, Vref25 and Vref26 included in the second group of reference voltages may have voltage levels for equally dividing a voltage between a first maximum reference voltage Vref_max1 and a first minimum reference voltage Vref_min1 into eight sections during the second clock cycle CYCLE2. In such a case, the first reference voltage Vref21 may have a highest voltage level among the first to sixth reference voltages Vref21~Vref26 and the reference mid-voltage Vcm, and the sixth reference voltage Vref26 may have a lowest voltage level among the first to sixth reference voltages Vref21~Vref26 and the reference mid-voltage Vcm. The first maximum reference voltage Vref_max1 may have a mid-level of the first voltage section 314 between the third reference voltage Vref13 and the reference mid-voltage Vcm in the first clock cycle CYCLE1. Thus, the first maximum reference voltage Vref_max1 may have a voltage level of "(9/16)×Vref (=(72/128)×Vref)". The first minimum reference voltage Vref_min1 may have a mid-level of the first voltage section 315 between the reference mid-voltage Vcm and the fourth reference voltage Vref14 in the first clock cycle CYCLE1. Thus, the first minimum reference voltage Vref_min1 may have a voltage level of "(7/16)×Vref (=(56/128)×Vref)".

As such, a total voltage section between the first maximum reference voltage Vref_max1 of "(9/16)×Vref" and the first minimum reference voltage Vref_min1 of "(7/16)×Vref" in the second clock cycle CYCLE2 may correspond to a subdivided voltage section of a range between a voltage level of "(4.5/8)×Vref (=(9/16)×Vref)" and a voltage level of "(3.5/8)×Vref (=(7/16)×Vref)" in the first clock cycle CYCLE1 and may have the reference mid-voltage Vcm as a mid-level thereof. In addition, the reference mid-voltage Vcm in the second clock cycle CYCLE2 may have the same level as the reference mid-voltage Vcm in the first clock cycle CYCLE1. In an embodiment, the first reference voltage Vref21 among the second group of reference voltages may have a voltage level of "(70/128)×Vref (=(8.75/16)×Vref)", the second reference voltage Vref22 among the second group of reference voltages may have a voltage level of "(68/128)×Vref (=(8.5/16)×Vref)", the third reference voltage Vref23 among the second group of reference voltages may have a voltage level of "(66/128)×Vref(=(8.25/16)×Vref)", the reference mid-voltage Vcm may have a voltage level of "(64/128)×Vref (=(8/16)×Vref)", the fourth reference voltage Vref24 among the second group of reference voltages may have a voltage level of "(62/128)×Vref (=(7.75/16)×Vref)", the fifth reference voltage Vref25 among the second group of reference voltages may have a voltage level of "(60/128)×Vref (=(7.5/16)×Vref)", and the sixth reference voltage Vref26 among the second group of reference voltages may have a voltage level of "(58/128)×Vref (=(7.25/16)×Vref)".

Even in the second clock cycle CYCLE2, there may be eight-number of second voltage sections 321~328 between the first maximum reference voltage Vref_max1 and the first minimum reference voltage Vref_min1, which are equally divided by the first to third reference voltages Vref21~Vref23, the reference mid-voltage Vcm, and the fourth to sixth reference voltages Vref24~Vref26. The second voltage section 321 between the first maximum reference voltage Vref_max1 and the first reference voltage Vref21 may correspond to a case that the output node voltage inputted to the first input terminals of the first to seventh comparators 141~147 is higher than the first to third reference voltages Vref21~Vref23, the reference mid-voltage Vcm, and the fourth to sixth reference voltages Vref24~Vref26 which are inputted to the second input terminals of the first to seventh comparators 141~147. In such a case, the comparison output data Cout<0:6> outputted from the first to seventh comparators 141~147 may have a logic level combination of '1111111'. The second voltage section 322 between the first reference voltage Vref21 and the second reference voltage Vref22 may correspond to a case that the output node voltage inputted to the first input terminals of the first to seventh comparators 141~147 is lower than the first reference voltage Vref21 inputted to the second input terminal of the first comparator 141 and is higher than the second to sixth reference voltages Vref22~Vref26 and the reference mid-voltage Vcm which are inputted to the second input terminals of the second to seventh comparators 142~147. In such a case, the comparison output data Cout<0:6> outputted from the first to seventh comparators 141~147 may have a logic level combination of '0111111'.

The second voltage section 323 between the second reference voltage Vref22 and the third reference voltage Vref23 may correspond to a case that the output node voltage inputted to the first input terminals of the first to seventh comparators 141~147 is lower than the first and second reference voltages Vref21 and Vref22 inputted to the second input terminals of the first and second comparators 141 and 142 and is higher than the third to sixth reference voltages Vref23~Vref26 and the reference mid-voltage Vcm which are inputted to the second input terminals of the third to seventh comparators 143~147. In such a case, the comparison output data Cout<0:6> outputted from the first to seventh comparators 141~147 may have a logic level combination of '0011111'. The second voltage section 324 between the third reference voltage Vref23 and the reference mid-voltage Vcm may correspond to a case that the output node voltage inputted to the first input terminals of the first to seventh comparators 141~147 is lower than the first to third reference voltages Vref21~Vref23 inputted to the second input terminals of the first to third comparators 141~143 and is higher than the reference mid-voltage Vcm and the fourth to sixth reference voltages Vref24~Vref26 which are inputted to the second input terminals of the fourth to seventh comparators 144~147. In such a case, the comparison output data Cout<0:6> outputted from the first to seventh comparators 141~147 may have a logic level combination of '0001111'.

The second voltage section 325 between the reference mid-voltage Vcm and the fourth reference voltage Vref24 may correspond to a case that the output node voltage inputted to the first input terminals of the first to seventh comparators 141~147 is lower than the first to third reference voltages Vref21~Vref23 and the reference mid-voltage Vcm which are inputted to the second input terminals of the first to fourth comparators 141~144 and is higher than the fourth to sixth reference voltages Vref24~Vref26 which are inputted to the second input terminals of the fifth to seventh comparators 145~147. In such a case, the comparison output data Cout<0:6> outputted from the first to seventh comparators 141~147 may have a logic level combination of '0000111'. The second voltage section 326 between the fourth reference voltage Vref24 and the fifth reference voltage Vref25 may correspond to a case that the output node voltage inputted to the first input terminals of the first to seventh comparators 141~147 is lower than the first to fourth reference voltages Vref21~Vref24 and the reference mid-voltage Vcm which are inputted to the second input terminals of the first to fourth comparators 141~145 and is higher than the fifth and sixth reference voltages Vref25 and Vref26 which are inputted to the second input terminals of the sixth and seventh comparators 146~147. In such a case, the comparison output data Cout<0:6> outputted from the first to seventh comparators 141~147 may have a logic level combination of '0000011'.

The second voltage section 327 between the fifth reference voltage Vref25 and the sixth reference voltage Vref26 may correspond to a case that the output node voltage inputted to the first input terminals of the first to seventh comparators 141~147 is lower than the first to fifth reference voltages Vref21~Vref25 and the reference mid-voltage Vcm which are inputted to the second input terminals of the first to sixth comparators 141~146 and is higher than the sixth reference voltage Vref26 which is inputted to the second input terminal of the seventh comparator 147. In such a case, the comparison output data Cout<0:6> outputted from the first to seventh comparators 141~147 may have a logic level combination of '0000001'. The second voltage section 328 between the sixth reference voltage Vref26 and the first minimum reference voltage Vref_min1 may correspond to a case that the output node voltage inputted to the first input terminals of the first to seventh comparators 141~147 is lower than the first to sixth reference voltages Vref21~Vref26 and the reference mid-voltage Vcm which are inputted to the second input terminals of the first to seventh comparators 141~147 and is higher than the first minimum reference voltage Vref_min1. In such a case, the comparison output data Cout<0:6> outputted from the first to seventh comparators 141~147 may have a logic level combination of '0000000'.

As the first to sixth switches SW51~SW56 included in the third group of switches are selectively turned on during the third clock cycle CYCLE3, the first to third reference voltages Vref31~Vref33 included in the third group of reference voltages, the reference mid-voltage Vcm, and the fourth to sixth reference voltages Vref34~Vref36 included in the third group of reference voltages may be used as the reference voltages of the first to seventh comparators 141~147, respectively (see FIG. 3). In an embodiment, the first to third reference voltages Vref31, Vref32 and Vref33 included in the third group of reference voltages, the reference mid-voltage Vcm, and the fourth to sixth reference voltages Vref34, Vref35 and Vref36 included in the third group of reference voltages may have voltage levels for equally dividing a voltage between a second maximum reference voltage Vref_max2 and a second minimum reference voltage Vref_min2 into eight sections during the third clock cycle CYCLE3. In such a case, the first reference voltage Vref31 may have a highest voltage level among the first to sixth reference voltages Vref31~Vref36 and the reference mid-voltage Vcm, and the sixth reference voltage Vref36 may have a lowest voltage level among the first to sixth reference voltages Vref31~Vref36 and the reference mid-voltage Vcm. The second maximum reference voltage Vref_max2 may have a mid-level of the first voltage section 324 between the third reference voltage Vref23 and the reference mid-voltage Vcm in the second clock cycle CYCLE2. Thus, the first maximum reference voltage Vref_max2 may have a voltage level of "(65/128)×Vref (=(520/1024)×Vref)". The second minimum reference voltage Vref_min2 may have a mid-level of the first voltage section 325 between the reference mid-voltage Vcm and the fourth reference voltage Vref24 in the second clock cycle CYCLE2. Thus, the second minimum reference voltage Vref_min2 may have a voltage level of "(63/128)×Vref (=(504/1024)×Vref)".

As such, a total voltage section between the second maximum reference voltage Vref_max2 of "(65/128)×Vref" and the second minimum reference voltage Vref_min2 of "(63/128)×Vref" in the third clock cycle CYCLE3 may correspond to a subdivided voltage section of a range between a voltage level of "(8.125/16)×Vref (=(65/128)×

Vref)" and a voltage level of "(7.875/16)×Vref (=(63/128)×Vref)" in the second clock cycle CYCLE2 and may have the reference mid-voltage Vcm as a mid-level thereof. In addition, the reference mid-voltage Vcm in the third clock cycle CYCLE3 may have the same level as the reference mid-voltage Vcm in the first and second clock cycles CYCLE1 and CYCLE2. In an embodiment, the first reference voltage Vref31 among the third group of reference voltages may have a voltage level of "(518/1024)×Vref (=(64.75/128)×Vref)", the second reference voltage Vref32 among the third group of reference voltages may have a voltage level of "(516/1024)×Vref (=(64.5/128)×Vref)", the third reference voltage Vref33 among the third group of reference voltages may have a voltage level of "(514/1024)×Vref(=(64.25/128)×Vref)", the reference mid-voltage Vcm may have a voltage level of "(512/1024)×Vref (=(64/128)×Vref)", the fourth reference voltage Vref34 among the third group of reference voltages may have a voltage level of "(510/1024)×Vref (=(63.75/128)×Vref)", the fifth reference voltage Vref35 among the third group of reference voltages may have a voltage level of "(508/1024)×Vref (=(63.5/128)×Vref)", and the sixth reference voltage Vref36 among the third group of reference voltages may have a voltage level of "(506/1024)×Vref (=(63.25/128)×Vref)".

Even in the third clock cycle CYCLE3, there may be eight-number of third voltage sections 331~338 between the second maximum reference voltage Vref_max2 and the second minimum reference voltage Vref_min2, which are equally divided by the first to third reference voltages Vref31~Vref33, the reference mid-voltage Vcm, and the fourth to sixth reference voltages Vref34~Vref36. The third voltage section 331 between the second maximum reference voltage Vref_max2 and the first reference voltage Vref31 may correspond to a case that the output node voltage inputted to the first input terminals of the first to seventh comparators 141~147 is higher than the first to third reference voltages Vref31~Vref33, the reference mid-voltage Vcm, and the fourth to sixth reference voltages Vref34~Vref36 which are inputted to the second input terminals of the first to seventh comparators 141~147. In such a case, the comparison output data Cout<0:6> outputted from the first to seventh comparators 141~147 may have a logic level combination of '1111111'. The third voltage section 332 between the first reference voltage Vref31 and the second reference voltage Vref32 may correspond to a case that the output node voltage inputted to the first input terminals of the first to seventh comparators 141~147 is lower than the first reference voltage Vref31 inputted to the second input terminal of the first comparator 141 and is higher than the second to sixth reference voltages Vref32~Vref36 and the reference mid-voltage Vcm which are inputted to the second input terminals of the second to seventh comparators 142~147. In such a case, the comparison output data Cout<0:6> outputted from the first to seventh comparators 141~147 may have a logic level combination of '0111111'.

The third voltage section 333 between the second reference voltage Vref32 and the third reference voltage Vref33 may correspond to a case that the output node voltage inputted to the first input terminals of the first to seventh comparators 141~147 is lower than the first and second reference voltages Vref31 and Vref32 inputted to the second input terminals of the first and second comparators 141 and 142 and is higher than the third to sixth reference voltages Vref33~Vref36 and the reference mid-voltage Vcm which are inputted to the second input terminals of the third to seventh comparators 143~147. In such a case, the comparison output data Cout<0:6> outputted from the first to seventh comparators 141~147 may have a logic level combination of '0011111'. The third voltage section 334 between the third reference voltage Vref33 and the reference mid-voltage Vcm may correspond to a case that the output node voltage inputted to the first input terminals of the first to seventh comparators 141~147 is lower than the first to third reference voltages Vref31~Vref33 inputted to the second input terminals of the first to third comparators 141~143 and is higher than the reference mid-voltage Vcm and the fourth to sixth reference voltages Vref34~Vref36 which are inputted to the second input terminals of the fourth to seventh comparators 144~147. In such a case, the comparison output data Cout<0:6> outputted from the first to seventh comparators 141~147 may have a logic level combination of '0001111'.

The third voltage section 335 between the reference mid-voltage Vcm and the fourth reference voltage Vref34 may correspond to a case that the output node voltage inputted to the first input terminals of the first to seventh comparators 141~147 is lower than the first to third reference voltages Vref31~Vref33 and the reference mid-voltage Vcm which are inputted to the second input terminals of the first to fourth comparators 141~144 and is higher than the fourth to sixth reference voltages Vref34~Vref36 which are inputted to the second input terminals of the fifth to seventh comparators 145~147. In such a case, the comparison output data Cout<0:6> outputted from the first to seventh comparators 141~147 may have a logic level combination of '0000111'. The third voltage section 336 between the fourth reference voltage Vref34 and the fifth reference voltage Vref35 may correspond to a case that the output node voltage inputted to the first input terminals of the first to seventh comparators 141~147 is lower than the first to fourth reference voltages Vref31~Vref34 and the reference mid-voltage Vcm which are inputted to the second input terminals of the first to fourth comparators 141~145 and is higher than the fifth and sixth reference voltages Vref35 and Vref36 which are inputted to the second input terminals of the sixth and seventh comparators 146~147. In such a case, the comparison output data Cout<0:6> outputted from the first to seventh comparators 141~147 may have a logic level combination of '0000011'.

The third voltage section 337 between the fifth reference voltage Vref35 and the sixth reference voltage Vref36 may correspond to a case that the output node voltage inputted to the first input terminals of the first to seventh comparators 141~147 is lower than the first to fifth reference voltages Vref31~Vref35 and the reference mid-voltage Vcm which are inputted to the second input terminals of the first to sixth comparators 141~146 and is higher than the sixth reference voltage Vref36 which is inputted to the second input terminal of the seventh comparator 147. In such a case, the comparison output data Cout<0:6> outputted from the first to seventh comparators 141~147 may have a logic level combination of '0000001'. The third voltage section 338 between the sixth reference voltage Vref36 and the second minimum reference voltage Vref_min2 may correspond to a case that the output node voltage inputted to the first input terminals of the first to seventh comparators 141~147 is lower than the first to sixth reference voltages Vref31~Vref36 and the reference mid-voltage Vcm which are inputted to the second input terminals of the first to seventh comparators 141~147 and is higher than the second minimum reference voltage Vref_min2. In such a case, the comparison output data Cout<0:6> outputted from the first to seventh comparators 141~147 may have a logic level combination of '0000000'.

The decoder 150 may decode the comparison output data Cout<0:6> to generate and output binary data. During the first clock cycle CYCLE1, the decoder 150 may decode the comparison output data Cout<0:6> to generate first binary output data at a first step that the output node voltage of the node NODE_B is a first output node voltage which is equal to a voltage level of the input voltage signal Vin and may decode the comparison output data Cout<0:6> to generate second binary output data at a second step that the output node voltage of the node NODE_B is a second output node voltage which is lower or higher than the first output node voltage. During the second clock cycle CYCLE2, the decoder 150 may decode the comparison output data Cout<0:6> to generate third binary output data at the second step that the output node voltage of the node NODE_B is the second output node voltage and may decode the comparison output data Cout<0:6> to generate fourth binary output data at a third step that the output node voltage of the node NODE_B is a third output node voltage which is lower or higher than the second output node voltage. During the third clock cycle CYCLE3, the decoder 150 may decode the comparison output data Cout<0:6> to generate fifth binary output data at the third step that the output node voltage of the node NODE_B is the third output node voltage and may decode the comparison output data Cout<0:6> to generate sixth binary output data at a fourth step that the output node voltage of the node NODE_B is a fourth output node voltage which is lower or higher than the third output node voltage. The digital output data DOUT<9:0> may include the first binary output data, the third binary output data and the fifth binary output data.

In an embodiment, the binary output data of the decoder 150 corresponding to the comparison output data Cout<0:6> may be defined as the following Table 1. As listed in Table 1, if the comparison output data Cout<0:6> having a logic level combination of '1111111' is inputted to the decoder 150, the decoder 150 may output the binary output data having a logic level combination of '111'. In addition, if the comparison output data Cout<0:6> having a logic level combination of '0001111' is inputted to the decoder 150, the decoder 150 may output the binary output data having a logic level combination of '100'.

TABLE 1

| Cout<0> | 1 | 0 | 0 | 0 | 0 | 0 | 0 | 0 |
|---|---|---|---|---|---|---|---|---|
| Cout<1> | 1 | 1 | 0 | 0 | 0 | 0 | 0 | 0 |
| Cout<2> | 1 | 1 | 1 | 0 | 0 | 0 | 0 | 0 |
| Cout<3> | 1 | 1 | 1 | 1 | 0 | 0 | 0 | 0 |
| Cout<4> | 1 | 1 | 1 | 1 | 1 | 0 | 0 | 0 |
| Cout<5> | 1 | 1 | 1 | 1 | 1 | 1 | 0 | 0 |
| Cout<6> | 1 | 1 | 1 | 1 | 1 | 1 | 1 | 0 |
| Binary Output Data | 111 | 110 | 101 | 100 | 011 | 010 | 001 | 000 |

Figure 4:
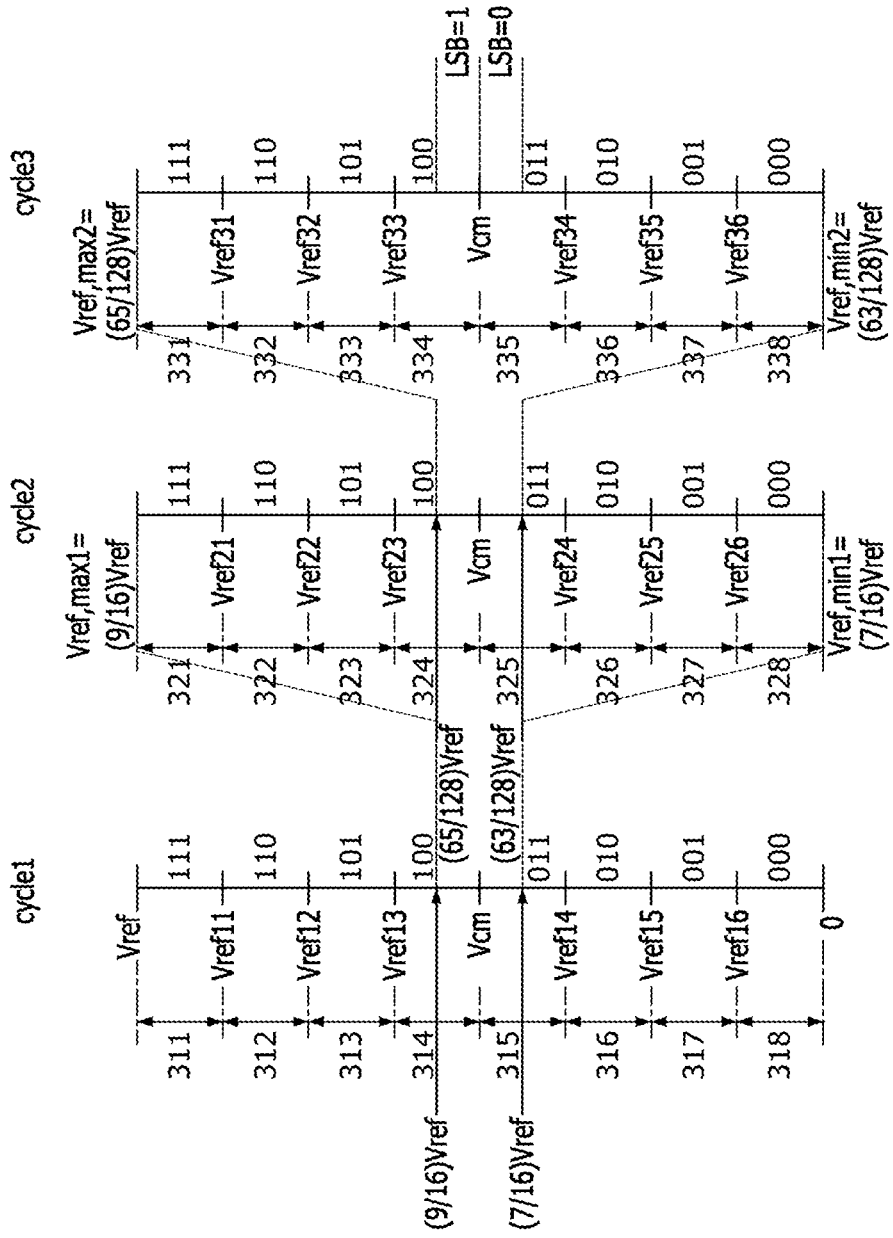
FIG. 4 illustrates a process for obtaining a datum of a least significant bit (LSB) included in an output signal of a current steering analog-to-digital converter according to an embodiment of the present disclosure.

Accordingly, as illustrated in FIG. 4, the first voltage section 311 between the maximum reference voltage Vref and the first reference voltage Vref11 in the first clock cycle CYCLE1 may be defined as the binary output data having a logic level combination of '111', and the first voltage section 312 between the first reference voltage Vref11 and the second reference voltage Vref12 in the first clock cycle CYCLE1 may be defined as the binary output data having a logic level combination of '110'. In addition, the first voltage section 313 between the second reference voltage Vref12 and the third reference voltage Vref13 in the first clock cycle CYCLE1 may be defined as the binary output data having a logic level combination of '101', and the first voltage section 314 between the third reference voltage Vref13 and the reference mid-voltage Vcm in the first clock cycle CYCLE1 may be defined as the binary output data having a logic level combination of '100'. Moreover, the first voltage section 315 between the reference mid-voltage Vcm and the fourth reference voltage Vref14 in the first clock cycle CYCLE1 may be defined as the binary output data having a logic level combination of '011', and the first voltage section 316 between the fourth reference voltage Vref14 and the fifth reference voltage Vref15 in the first clock cycle CYCLE1 may be defined as the binary output data having a logic level combination of '010'. Further, the first voltage section 317 between the fifth reference voltage Vre15 and the sixth reference voltage Vref16 in the first clock cycle CYCLE1 may be defined as the binary output data having a logic level combination of '001', and the first voltage section 318 between the sixth reference voltage Vref16 and the ground voltage in the first clock cycle CYCLE1 may be defined as the binary output data having a logic level combination of '000'.

In the second clock cycle CYCLE2, the second voltage section 321 between the first maximum reference voltage Vref_max1 and the first reference voltage Vref21 may be defined as the binary output data having a logic level combination of '111', and the second voltage section 322 between the first reference voltage Vref21 and the second reference voltage Vref22 may be defined as the binary output data having a logic level combination of '110'. In the second clock cycle CYCLE2, the second voltage section 323 between the second reference voltage Vref22 and the third reference voltage Vref23 may be defined as the binary output data having a logic level combination of '101', and the second voltage section 324 between the third reference voltage Vref23 and the reference mid-voltage Vcm may be defined as the binary output data having a logic level combination of '100'. In the second clock cycle CYCLE2, the second voltage section 325 between the reference mid-voltage Vcm and the fourth reference voltage Vref24 may be defined as the binary output data having a logic level combination of '011', and the second voltage section 326 between the fourth reference voltage Vref24 and the fifth reference voltage Vref25 may be defined as the binary output data having a logic level combination of '010'. In the second clock cycle CYCLE2, the second voltage section 327 between the fifth reference voltage Vre25 and the sixth reference voltage Vref26 may be defined as the binary output data having a logic level combination of '001', and the second voltage section 328 between the sixth reference voltage Vref26 and the first minimum reference voltage Vref_min1 may be defined as the binary output data having a logic level combination of '000'.

In the third clock cycle CYCLE3, the third voltage section 331 between the second maximum reference voltage Vref_max2 and the first reference voltage Vref31 may be defined as the binary output data having a logic level combination of '111', and the third voltage section 332 between the first reference voltage Vref31 and the second reference voltage Vref32 may be defined as the binary output data having a logic level combination of '110'. In the third clock cycle CYCLE3, the third voltage section 333 between the second reference voltage Vref32 and the third reference voltage Vref33 may be defined as the binary output data having a logic level combination of '101', and the third voltage section 334 between the third reference voltage Vref33 and the reference mid-voltage Vcm may be defined as the binary output data having a logic level combination of '100'. In the third clock cycle CYCLE3, the third voltage section 335 between the reference mid-voltage Vcm and the fourth reference voltage Vref34 may be defined as the binary output data having a logic level combination of '011', and the third voltage section 336 between the fourth reference voltage Vref34 and the fifth reference voltage Vref35 may be defined as the binary output data having a logic level combination of '010'. In the third clock cycle CYCLE3, the third voltage section 337 between the fifth reference voltage Vre35 and the sixth reference voltage Vref36 may be defined as the binary output data having a logic level combination of '001', and the third voltage section 338 between the sixth reference voltage Vref36 and the second minimum reference voltage Vref_min2 may be defined as the binary output data having a logic level combination of '000'.

The decoder 150 may output the first binary output data in the first clock cycle CYCLE1 as the data of the first bit (i.e., the MSB) to the third bit of the digital output data DOUT<9:0>, may output the third binary output data in the second clock cycle CYCLE2 as the data of the fourth bit to the sixth bit of the digital output data DOUT<9:0>, and may output the fifth binary output data in the third clock cycle CYCLE3 as the data of the seventh bit to the ninth bit of the digital output data DOUT<9:0>. A datum of the LSB of the digital output data DOUT<9:0> may be determined by the sixth binary output data in the third clock cycle CYCLE3. That is, the LSB of the digital output data DOUT<9:0> may have a logic "high(1)" level if the sixth binary output data in the third clock cycle CYCLE3 have a logic level combination of '100', and the LSB of the digital output data DOUT<9:0> may have a logic "low(0)" level if the sixth binary output data in the third clock cycle CYCLE3 have a logic level combination of '011'.

Figure 5:
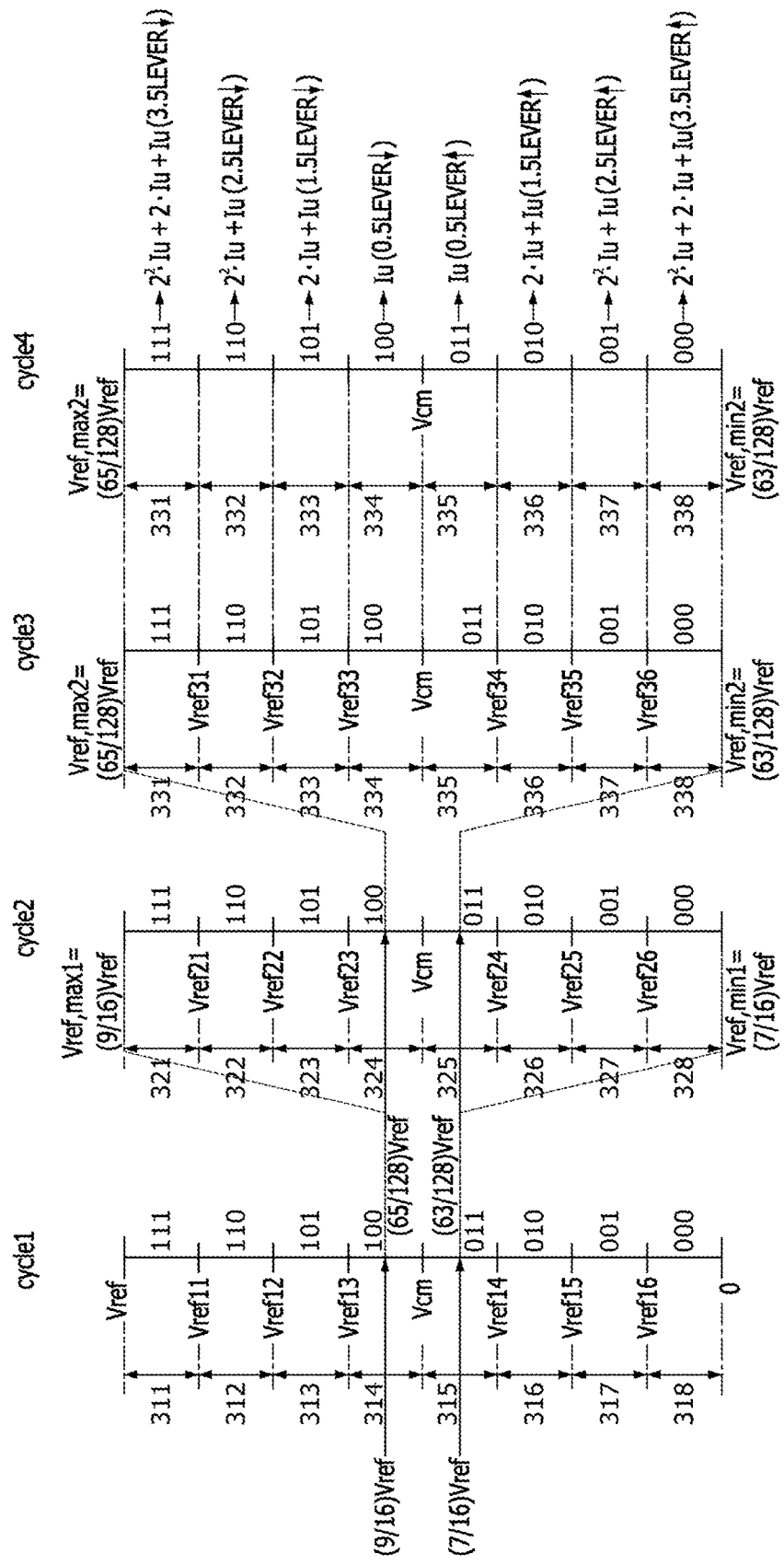
FIGS. 5 to 7 illustrates a mismatch correction process of a current steering analog-to-digital converter according to an embodiment of the present disclosure.

The decoder 150 may generate a flag signal for mismatch correction after the decoder 150 performs a conversion operation during a final clock cycle, for example, during the third clock cycle CYCLE3. In such a case, a mismatch correction operation may be performed to generate the flag signal during a fourth clock cycle CYCLE4 after the third clock cycle CYCLE3. For example, as illustrated in FIG. 5, in the fourth clock cycle CYCLE4, seventh binary output data generated after the output node voltage of the node NODE_B is changed may have a logic level combination of '100' or '011'.

In an embodiment, if the sixth binary output data have a logic level combination of '111', the current driving circuit 130 may be controlled so that a current having an amount of "$2^2 \times Iu + 2 \times Iu + Iu$" flows from the node NODE_B toward the ground voltage terminal. If the sixth binary output data have a logic level combination of '110', the current driving circuit 130 may be controlled so that a current having an amount of "$2 \times Iu + Iu$" flows from the node NODE_B toward the ground voltage terminal. If the sixth binary output data have a logic level combination of '101', the current driving circuit 130 may be controlled so that a current having an amount of "$2 \times Iu + Iu$" flows from the node NODE_B toward the ground voltage terminal. If the sixth binary output data have a logic level combination of '100', the current driving circuit 130 may be controlled so that a current having an amount of "Iu" flows from the node NODE_B toward the ground voltage terminal. If the sixth binary output data have a logic level combination of '000', the current driving circuit 130 may be controlled so that a current having an amount of "$2^2 \times Iu + 2 \times Iu + Iu$" flows from the power supply voltage terminal toward the node NODE_B. If the sixth binary output data have a logic level combination of '001', the current driving circuit 130 may be controlled so that a current having an amount of "$2^2 \times Iu + Iu$" flows from the power supply voltage terminal toward the node NODE_B. If the sixth binary output data have a logic level combination of '010', the current driving circuit 130 may be controlled so that a current having an amount of "$2 \times Iu + Iu$" flows from the power supply voltage terminal toward the node NODE_B. If the sixth binary output data have a logic level combination of '011', the current driving circuit 130 may be controlled so that a current having an amount of "Iu" flows from the power supply voltage terminal toward the node NODE_B.

If the unit current Iu flows from the node NODE_B toward the ground voltage terminal in the current driving circuit 130 when the output node voltage at the node NODE_B has a voltage level in the third voltage section 334, the output node voltage at the node NODE_B may be lowered by 0.5 times (i.e., a half level) a voltage range of the third voltage section 334. If the unit current Iu flows from the power supply voltage terminal toward the node NODE_B in the current driving circuit 130 when the output node voltage at the node NODE_B has a voltage level in the third voltage section 335, the output node voltage at the node NODE_B may be increased by 0.5 times (i.e., a half level) a voltage range of the third voltage section 335. If a current having an amount of "$2 \times Iu + Iu$" flows from the node NODE_B toward the ground voltage terminal in the current driving circuit 130 when the output node voltage at the node NODE_B has a voltage level in the third voltage section 333, the output node voltage at the node NODE_B may be lowered by 1.5 times (i.e., 1.5 levels) a voltage range of the third voltage section 333. If a current having an amount of "$2 \times Iu + Iu$" flows from the power supply voltage terminal toward the node NODE_B in the current driving circuit 130 when the output node voltage at the node NODE_B has a voltage level in the third voltage section 336, the output node voltage at the node NODE_B may be increased by 1.5 times (i.e., 1.5 levels) a voltage range of the third voltage section 336. If a current having an amount of "$2^2 \times Iu + Iu$" flows from the node NODE_B toward the ground voltage terminal in the current driving circuit 130 when the output node voltage at the node NODE_B has a voltage level in the third voltage section 332, the output node voltage at the node NODE_B may be lowered by 2.5 times (i.e., 2.5 levels) a voltage range of the third voltage section 332. If a current having an amount of "$2^2 \times Iu + Iu$" flows from the power supply voltage terminal toward the node NODE_B in the current driving circuit 130 when the output node voltage at the node NODE_B has a voltage level in the third voltage section 337, the output node voltage at the node NODE_B may be increased by 2.5 times (i.e., 2.5 levels) a voltage range of the third voltage section 337. If a current having an amount of "$2^2 \times Iu + 2 \times Iu + Iu$" flows from the node NODE_B toward the ground voltage terminal in the current driving circuit 130 when the output node voltage at the node NODE_B has a voltage level in the third voltage section 331, the output node voltage at the node NODE_B may be lowered by 3.5 times (i.e., 3.5 levels) a voltage range of the third voltage section 331. If a current having an amount of "$2^2 \times Iu + 2 \times Iu + Iu$" flows from the power supply voltage terminal toward the node NODE_B in the current driving circuit 130 when the output node voltage at the node NODE_B has a voltage level in the third voltage section 338, the output node voltage at the node NODE_B may be increased by 3.5 times (i.e., 3.5 levels) a voltage range of the third voltage section 338.

Figure 6:
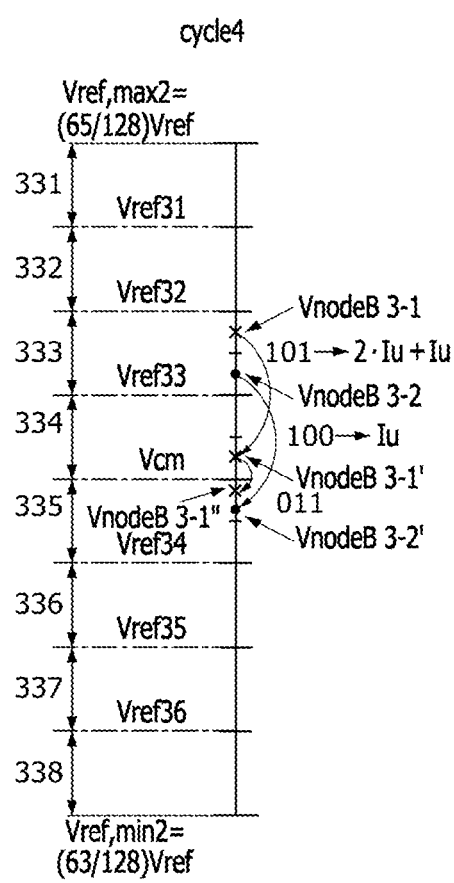

Variation of the third output node voltage induced at the node NODE_B at the third step according to a current flowing through the current driving circuit 130 will be described hereinafter with reference to FIG. 6 in conjunction with an example in which the third output node voltage has a voltage level between the second and third reference voltages Vref32 and Vref33 (that is, the binary output data outputted from the decoder 150 have a logic level combination of '101'). In such a case, the third output node voltage may have a voltage level corresponding to any one of a first case and a second case. The first case means that the third output node voltage is a third output node voltage VnodeB_3-1 having a voltage level which is closer to the second reference voltage Vref32 rather than the third reference voltage Vref33, and the second case means that the third output node voltage is a third output node voltage VnodeB_3-2 having a voltage level which is closer to the third reference voltage Vref33 rather than the second reference voltage Vref32. In the first case, a current having an amount of "2×Iu+Iu" may flow from the node NODE_B toward the ground voltage terminal during the fourth clock cycle CYCLE4. In such a case, the third output node voltage VnodeB_3-1 may be lowered by 1.5 times a voltage range of the third voltage section 333 to provide an output node voltage VnodeB_3-1' which is still higher than the reference mid-voltage Vcm. That is, the comparison output data Cout<0:6> outputted from the first to seventh comparators 141~147 may have a logic level combination of '0001111', and the decoder 150 may output the binary output data having a logic level combination of '100'. In such a case, the current driving circuit 130 may be controlled so that the unit current Iu additionally flows from the node NODE_B toward the ground voltage terminal, in order to verify whether the output node voltage VnodeB_3-1' has a voltage level corresponding to a logic "high(1)" level of the LSB included in the digital output data DOUT<9:0> (that is, whether the output node voltage VnodeB_3-1' is higher than the reference mid-voltage Vcm). If the output node voltage VnodeB_3-1' is lowered by a half level of the third voltage section due to the additional unit current Iu to provide an output node voltage VnodeB_3-1" which is lower than the reference mid-voltage Vcm, an output signal of the fourth comparator 144 may change from a logic "high(1)" level into a logic "low(0)" level. As such, if the output signal of the fourth comparator 144 receiving the output node voltage VnodeB_3-1" and the reference mid-voltage Vcm changes from a logic "high(1)" level into a logic "low(0)" level, it means that the output node voltage VnodeB_3-1' at the previous step has a voltage level corresponding to a logic "high(1)" level of the LSB included in the digital output data DOUT<9:0>. That is, it means that the output node voltage VnodeB_3-1' at the previous step is higher than the reference mid-voltage Vcm. In such a case, the decoder 150 may generate a flag signal having a logic "low(0)" level. In the second case, a current having an amount of "2×Iu+Iu" may flow from the node NODE_B toward the ground voltage terminal during the fourth clock cycle CYCLE4. In such a case, the third output node voltage VnodeB_3-2 may be lowered by 1.5 times a voltage range of the third voltage section 333 to provide an output node voltage VnodeB_3-2' which is lower than the reference mid-voltage Vcm. That is, the comparison output data Cout<0:6> outputted from the first to seventh comparators 141~147 may have a logic level combination of '0000111', and the decoder 150 may output the binary output data having a logic level combination of '011'. In such a case, an output signal of the fourth comparator 144 changes from a logic "high(1)" level into a logic "low(0)" level. Thus, the decoder 150 may generate a flag signal having a logic "low(0)" level without any further operation that the additional unit current Iu flows through the current driving circuit 130.

Figure 7:
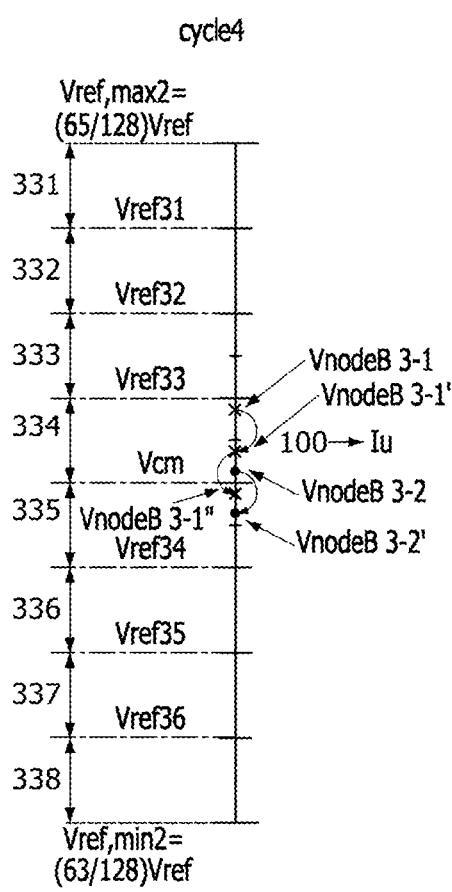

Variation of the third output node voltage induced at the node NODE_B at the third step according to a current flowing through the current driving circuit 130 will be described hereinafter with reference to FIG. 7 in conjunction with other examples in which the third output node voltage has a voltage level between the third reference voltage Vref33 and the reference mid-voltage Vcm (that is, the binary output data outputted from the decoder 150 have a logic level combination of '100'). In such a case, the third output node voltage may have a voltage level corresponding to any one of a first case and a second case. The first case means that the third output node voltage is a third output node voltage VnodeB_3-1 having a voltage level which is closer to the third reference voltage Vref33 rather than the reference mid-voltage Vcm, and the second case means that the third output node voltage is a third output node voltage VnodeB_3-2 having a voltage level which is closer to the reference mid-voltage Vcm rather than the third reference voltage Vref33. In the first case, the unit current Iu may flow from the node NODE_B toward the ground voltage terminal during the fourth clock cycle CYCLE4. In such a case, the third output node voltage VnodeB_3-1 may be lowered by 0.5 times (a half level) a voltage range of the third voltage section 334 to provide an output node voltage VnodeB_3-1' which is still higher than the reference mid-voltage Vcm. That is, the comparison output data Cout<0:6> outputted from the first to seventh comparators 141~147 may have the same logic level combination ('0001111') as that of the previous comparison output data Cout<0:6>, and the decoder 150 may output the binary output data having the same logic level combination ('100') as that of the previous binary output data. In such a case, the current driving circuit 130 may be controlled so that the unit current Iu additionally flows from the node NODE_B toward the ground voltage terminal. If the output node voltage VnodeB_3-1' is lowered by a half level of the third voltage section due to the additional unit current Iu to provide an output node voltage VnodeB_3-1" which is lower than the reference mid-voltage Vcm, an output signal of the fourth comparator 144 may change from a logic "high(1)" level into a logic "low(0)" level. As such, if the output signal of the fourth comparator 144 receiving the output node voltage VnodeB_3-1" and the reference mid-voltage Vcm changes from a logic "high(1)" level into a logic "low(0)" level, it means that the output node voltage VnodeB_3-1' at the previous step has a voltage level corresponding to a logic "high(1)" level of the LSB included in the digital output data DOUT<9:0>. That is, it means that the output node voltage VnodeB_3-1' at the previous step is higher than the reference mid-voltage Vcm. In such a case, the decoder 150 may generate a flag signal having a logic "low(0)" level. In the second case, the unit current Iu may flow from the node NODE_B toward the ground voltage terminal during the fourth clock cycle CYCLE4. In such a case, the third output node voltage VnodeB_3-2 may be lowered by 0.5 times (i.e., a half level) a voltage range of the third voltage section 334 to provide an output node voltage VnodeB_3-2' which is lower than the reference mid-voltage Vcm. That is, the comparison output data Cout<0:6> outputted from the first to seventh comparators 141~147 may have a logic level combination of '0000111', and the decoder 150 may output the binary output data having a logic level combination of '011'. In such a case, an output signal of the fourth comparator 144 changes from a logic "high(1)" level into a logic "low(0)" level. Thus, the decoder 150 may generate a flag signal having a logic "low(0)" level without any further operation that the additional unit current Iu flows through the current driving circuit 130.

If no flag signal is inputted to the mismatch correction logic circuit 160 or a flag signal having a logic "high(1)" level is inputted to the mismatch correction logic circuit 160, the mismatch correction logic circuit 160 may output the binary output data generated from the decoder 150 as the digital output data DOUT<9:0> corresponding to final converted output data. If the flag signal is generated to have a logic "low(0)" level due to a mismatch, the mismatch correction logic circuit 160 may perform a mismatch correction operation.

As described with reference to FIG. 6, if the third output node voltage has a voltage level between the second and third reference voltages Vref32 and Vref33 (that is, the binary output data of the decoder 150 have a logic level combination of '101') and the third output node voltage has a voltage level which is closer to the second reference voltage Vref32 rather than the third reference voltage Vref33 (i.e., corresponding to the first case), the binary output data of the decoder 150 may change to have a logic level combination of '100' after a current having an amount of "2×Iu+Iu" flows from the node NODE_B toward the ground voltage terminal in the current driving circuit 130. In such a case, since the output signal of the fourth comparator 144 changes from a logic "high(1)" level into a logic "low(0)" level and the flag signal is generated, the mismatch correction logic circuit 160 may add the binary data '101' corresponding to the current "2×Iu+Iu", the binary data '100' corresponding to the unit current "Iu", and the binary data '0' of the flag signal to data having 9 bits (including an MSB) comprised of the first binary output data, the third binary output data, and the fifth binary output data. As a result of the adding operation, the mismatch correction logic circuit 160 may generate final digital output data DOUT<9:0> having 10 bits (from MSB to LSB), a mismatch error of which is corrected.

In the second case that the third output node voltage has a voltage level which is closer to the third reference voltage Vref33 rather than the second reference voltage Vref32, the binary output data of the decoder 150 may change to have a logic level combination of '011' after a current having an amount of "2×Iu+Iu" flows from the node NODE_B toward the ground voltage terminal in the current driving circuit 130. In such a case, since the output signal of the fourth comparator 144 changes from a logic "high(1)" level into a logic "low(0)" level, the flag signal having a logic "low(0)" level may be generated without any further operation. Thus, the mismatch correction logic circuit 160 may add the binary data '101' corresponding to the current "2×Iu+Iu" and the binary data '0' of the flag signal to the data having 9 bits (including an MSB) comprised of the first binary output data, the third binary output data, and the fifth binary output data. As a result of the adding operation, the mismatch correction logic circuit 160 may generate final digital output data DOUT<9:0> having 10 bits (from MSB to LSB), a mismatch error of which is corrected.

The reference voltage generation circuit 170 may generate the various reference voltages which are inputted to the first to seventh comparators 141~147 constituting the comparison circuit 140. The switching control logic circuit 180 may supply switching control signals to the switches included in the sampling switch circuit 110, the current driving circuit 130 and the comparison circuit 140, in response to the comparison output data Cout<0:6> outputted from the comparison circuit 140. The clock generation circuit 190 may generate a clock signal which is used in overall operations of the current steering analog-to-digital converter 100.

Figure 8:
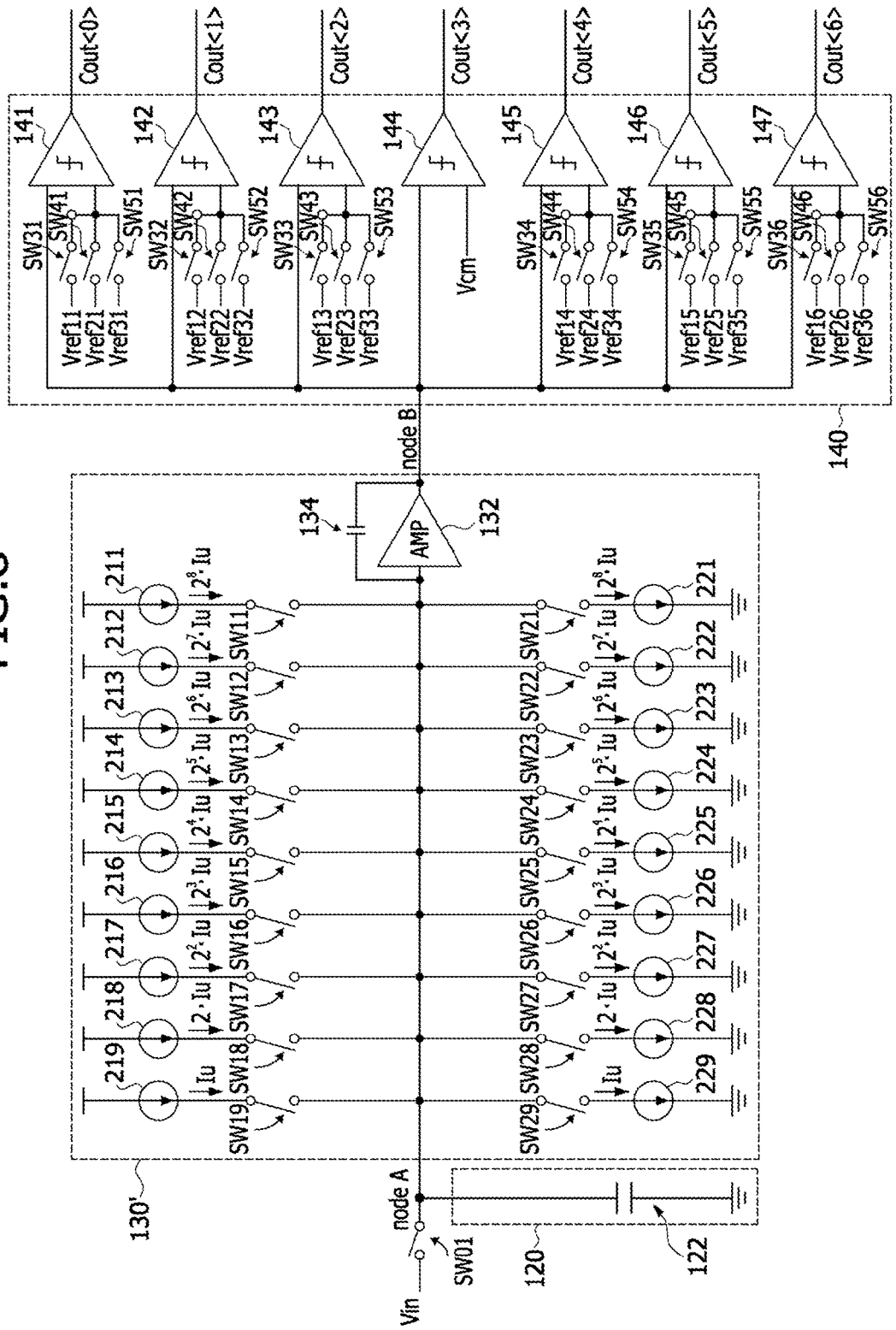
FIG. 8 is a circuit diagram illustrating other examples of a current driving circuit included in the current steering analog-to-digital converter illustrated in FIG. 1.

FIG. 8 is a circuit diagram illustrating other examples of the current driving circuit 130 included in the current steering analog-to-digital converter 100 illustrated in FIG. 1. In FIG. 8, the same reference numerals or the same reference designators as used in FIG. 2 denote the same elements. Thus, to avoid duplicate explanation, descriptions of the same elements as illustrated in FIG. 2 will be omitted or briefly mentioned. Referring to FIG. 8, a current driving circuit 130' corresponding to another example of the current driving circuit 130 illustrated in FIG. 1 may further include an impedance device that is comprised of an operational amplifier 132 and a feedback capacitor 134 as compared with the current driving circuit 130 illustrated on FIG. 2. The impedance device may be coupled between an output node of a current driver and the output node NODE_B of the current driving circuit 130'. The current driver may correspond to the current driving circuit 130 which is comprised of the additive current steering sources 211~219, the subtractive current steering sources 221~229, the additive switches SW11~SW19 and the subtractive switches SW21~SW29 which are illustrated in FIG. 2. An input terminal of the operational amplifier 132 may be coupled to an output terminal of the current driver. An output terminal of the operational amplifier 132 may be coupled to the node NODE_B. The feedback capacitor 134 may be coupled between the input terminal and the output terminal of the operational amplifier 132. The impedance device may increase an output impedance value of the current driver. Thus, even though an amount of a current flowing through the current driver is non-uniform, fluctuation of the output node voltage at the node NODE_B may be less sensitive to the non-uniform current of the current driver because of the presence of the impedance device.

Figure 9:
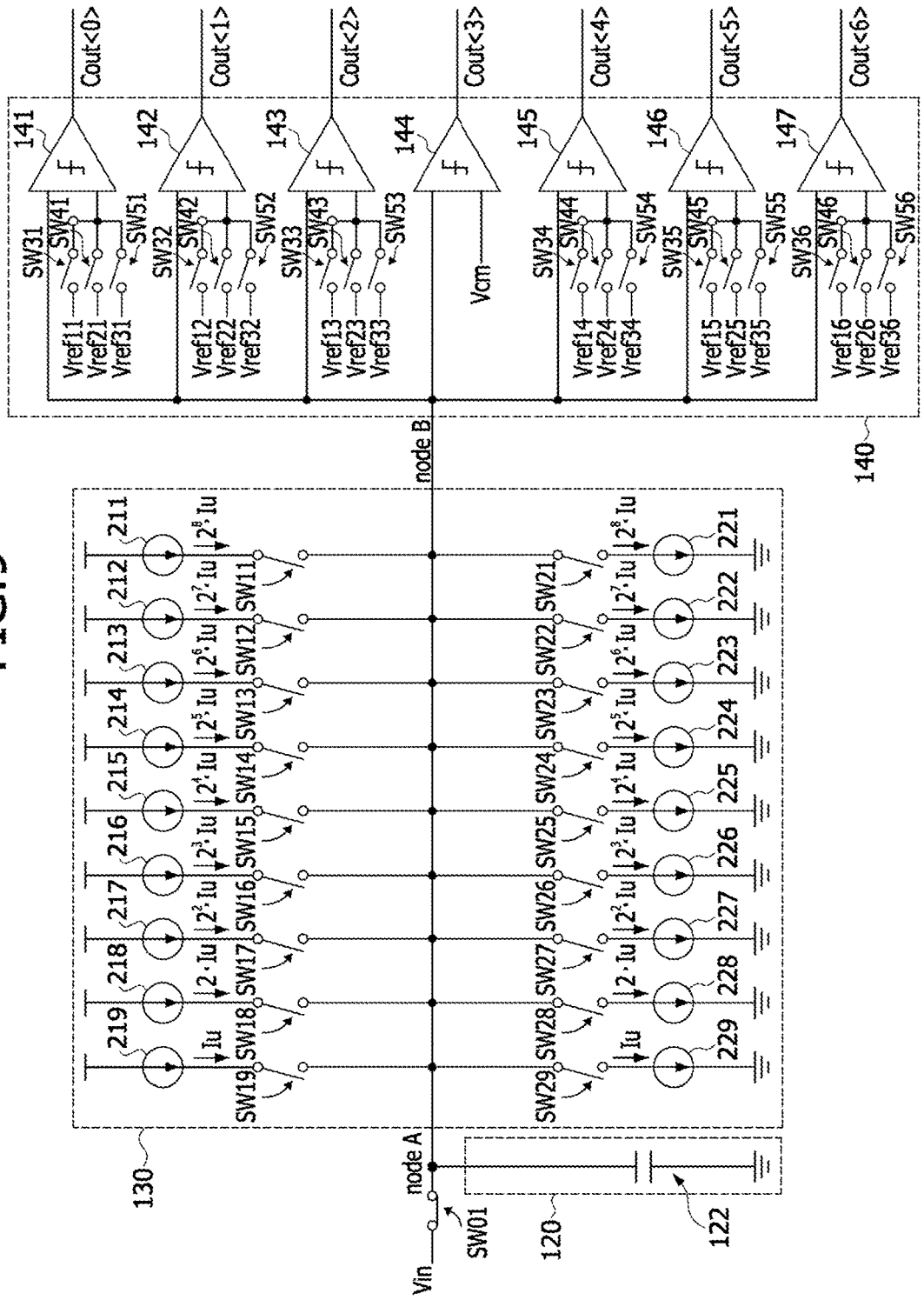
FIGS. 9 to 21 illustrate an example of an operation of a current steering analog-to-digital converter according to an embodiment of the present disclosure.

FIGS. 9 to 21 illustrate an example of an operation of the current steering analog-to-digital converter 100 according to an embodiment of the present disclosure. In FIGS. 9 to 21, the same reference numerals or the same reference designators as used in FIG. 2 denote the same elements. Referring to FIG. 9, if the input voltage Vin is applied to the sampling switch SW01, the sampling switch SW01 may be turned on to charge the sampling capacitor 122 of the sampling circuit 120. If the sampling capacitor 122 is fully charged, the sampling switch SW01 may be turned off to terminate a sampling step. During the sampling step, all of the switches in the current driving circuit 130 and the comparison circuit 140 may be turned off.

Figure 10:
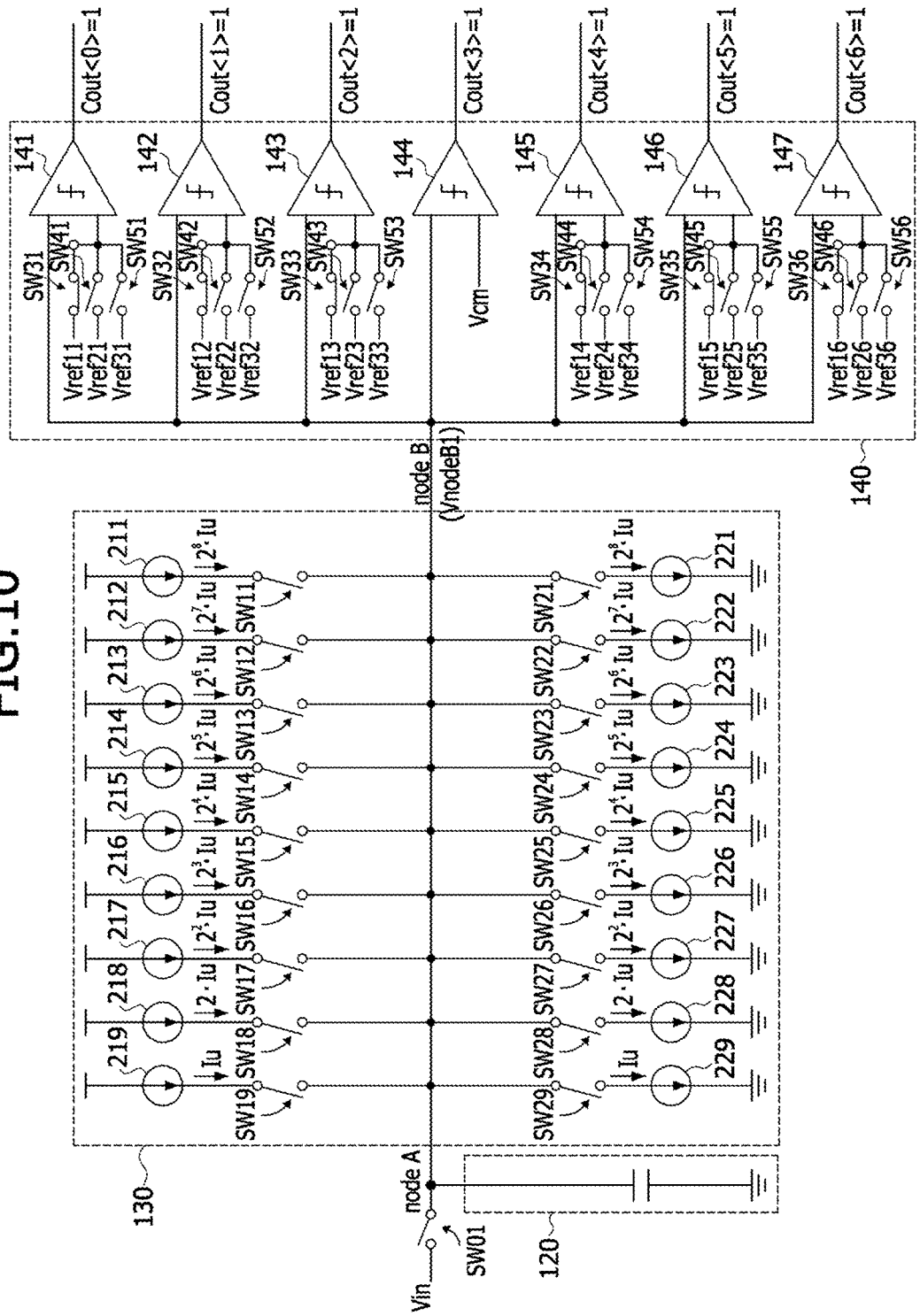
Figure 11:
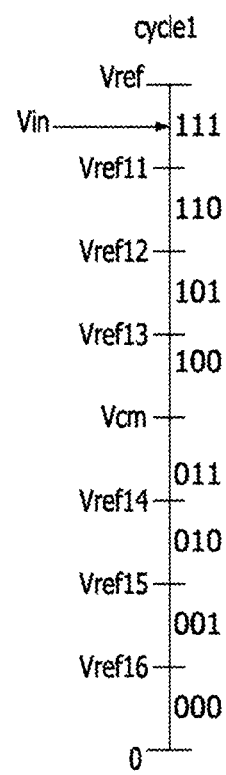

Referring to FIGS. 10 and 11, if the sampling step terminates, a first converting operation may be performed during the first clock cycle CYCLE1. First, while the sampling capacitor 122 is turned off, the first to sixth switches SW31~SW36 of the first group of switches included in the comparison circuit 140 may be turned on. In such a case, the first to ninth additive switches SW11~SW19 and the first to ninth subtractive switches SW21~SW29 in the current driving circuit 130 as well as the first to sixth switches SW41~SW46 of the second group of switches and the first to sixth switches SW51~SW56 of the third group of switches in the comparison circuit 140 may be turned off. Thus, the output node voltage at the node NODE_B may be a first output node voltage VnodeB1 which is equal to the input voltage Vin, and the first output node voltage VnodeB1 may be applied to the first input terminals of the first to seventh comparators 141~147. The first to third reference voltages Vref11~Vref13 included in the first group of reference voltages, the reference mid-voltage Vcm, and the fourth to sixth reference voltages Vref14~Vref16 included in the first group of reference voltages may be applied to the second input terminals of the first to seventh comparators 141~147, respectively. If the first output node voltage VnodeB1 has a voltage level between the maximum reference voltage Vref and the first reference voltage Vref11, all of the first to seventh comparators 141~147 may output the comparison output data Cout<0:6> having a logic "high(1)" level. Accordingly, the comparison output data Cout<0:6> inputted to the decoder 150 may have a logic level combination of '1111111'. The decoder 150 may output the first binary output data having a logic level combination of '111' corresponding to the comparison output data Cout<0:6> having a logic level combination of '1111111', as listed in the table 1. The first binary output data having a logic level combination of '111' may constitute data of the first bit (i.e., the MSB) to the third bit included in the ten-bit digital output signal.

Figure 12:
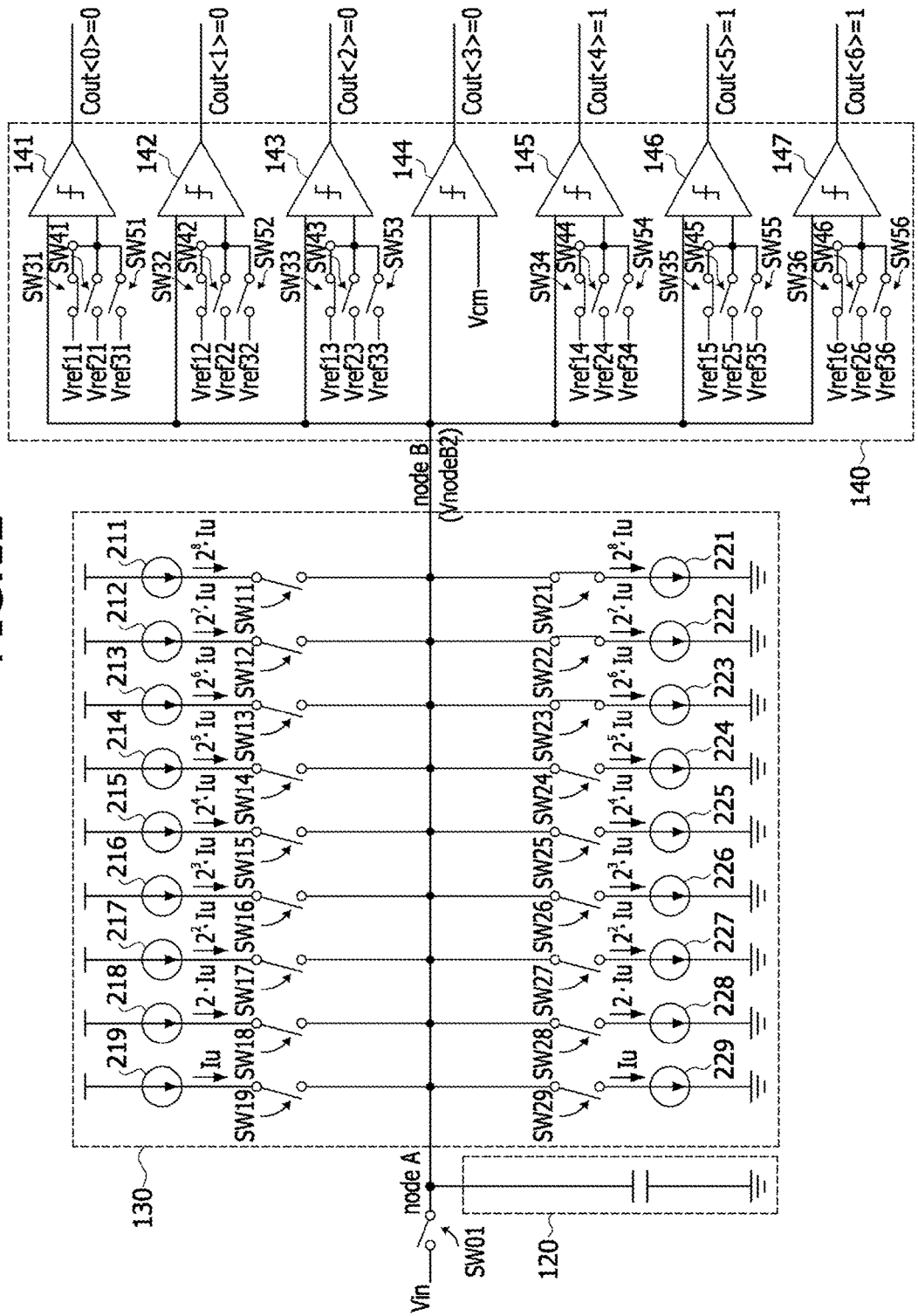
Figure 13:
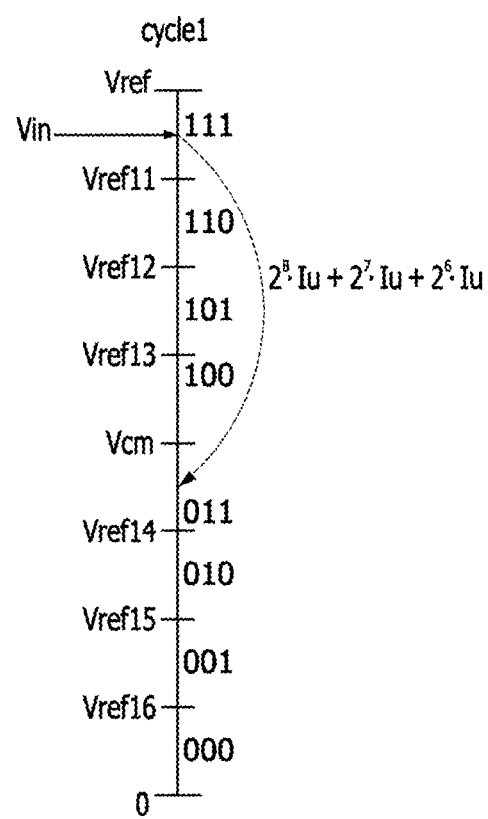

Referring to FIGS. 12 and 13, if the first binary output data having a logic level combination of '111' corresponding to the first output node voltage VnodeB1 are outputted from the decoder 150, a second converting operation may be performed during the first clock cycle CYCLE1. Hereinafter, the following converting operations will be described in conjunction with an example in which the first output node voltage VnodeB1 is closer to the first reference voltage Vref11 rather than the maximum reference voltage Vref. For example, some of the subtractive current steering sources 221~229 may be electrically connected to the node NODE_B to lower a voltage level of the node NODE_B. In order to lower the first output node voltage VnodeB1 in the voltage section corresponding to the first binary output data '111' to a voltage level close to the reference mid-voltage Vcm during the first clock cycle CYCLE1, it may be necessary to generate a current having an amount of "$2^8 \times Iu + 2^7 \times Iu + 2^6 \times Iu$" flowing from the node NODE_B toward the ground voltage terminal. In such a case, the first output node voltage VnodeB1 may be lowered by 3.5 times a voltage range of the voltage section corresponding to the first binary output data '111'. In another embodiment, if the first binary output data having a logic level combination of '110' corresponding to the first output node voltage VnodeB1 are outputted from the decoder 150, it may be necessary to generate a current having an amount of "$2^8 \times Iu + 2^6 \times Iu$" flowing from the node NODE_B toward the ground voltage terminal. In such a case, the first output node voltage VnodeB1 may be lowered by 2.5 times a voltage range of the voltage section corresponding to the first binary output data '110'. In yet another embodiment, if the first binary output data having a logic level combination of '101' corresponding to the first output node voltage VnodeB1 are outputted from the decoder 150, it may be necessary to generate a current having an amount of "$2^7 \times Iu + 2^6 \times Iu$" flowing from the node NODE_B toward the ground voltage terminal. In such a case, the first output node voltage VnodeB1 may be lowered by 1.5 times a voltage range of the voltage section corresponding to the first binary output data '101'. In still another embodiment, if the first binary output data having a logic level combination of '100' corresponding to the first output node voltage VnodeB1 are outputted from the decoder 150, it may be necessary to generate a current having an amount of "$2^6 \times Iu$" flowing from the node NODE_B toward the ground voltage terminal. In such a case, the first output node voltage VnodeB1 may be lowered by 0.5 times a voltage range of the voltage section corresponding to the first binary output data '100'. If the first binary output data having a logic level combination of '000', '001', '010' or '011' are outputted from the decoder 150, it may be necessary to generate an appropriate current flowing from the power supply voltage terminal toward the node NODE_B using the additive current steering sources 211~219 instead of the subtractive current steering sources 221~229.

If the first binary output data '111' corresponding to the first output node voltage VnodeB1 are outputted from the decoder 150, the first to third subtractive switches SW21~SW23 connected to the first to third subtractive current steering sources 221~223 may be turned on and the first to ninth additive switches SW11~SW19 and the fourth to ninth subtractive switches SW24~SW29 may be turned off. Thus, a current having an amount of "$2^8 \times Iu + 2^7 \times Iu + 2^6 \times Iu$" may flow from the node NODE_B toward the ground voltage terminal, and the first output node voltage VnodeB1 at the node NODE_B may be lowered to provide a second output node voltage VnodeB2 which is lower than the reference mid-voltage Vcm. If the second output node voltage VnodeB2 has a voltage level between the reference mid-voltage Vcm and the fourth reference voltage Vref14, all of the first to fourth comparators 141~144 may output data having a logic "low(0)" level and all of the fifth to seventh comparators 145~147 may output data having a logic "high(1)" level. Accordingly, the comparison output data Cout<0:6> inputted to the decoder 150 may have a logic level combination of '0000111'. The decoder 150 may output the second binary output data having a logic level combination of '011' corresponding to the comparison output data Cout<0:6> having a logic level combination of '0000111', as listed in the table 1.

Figure 14:
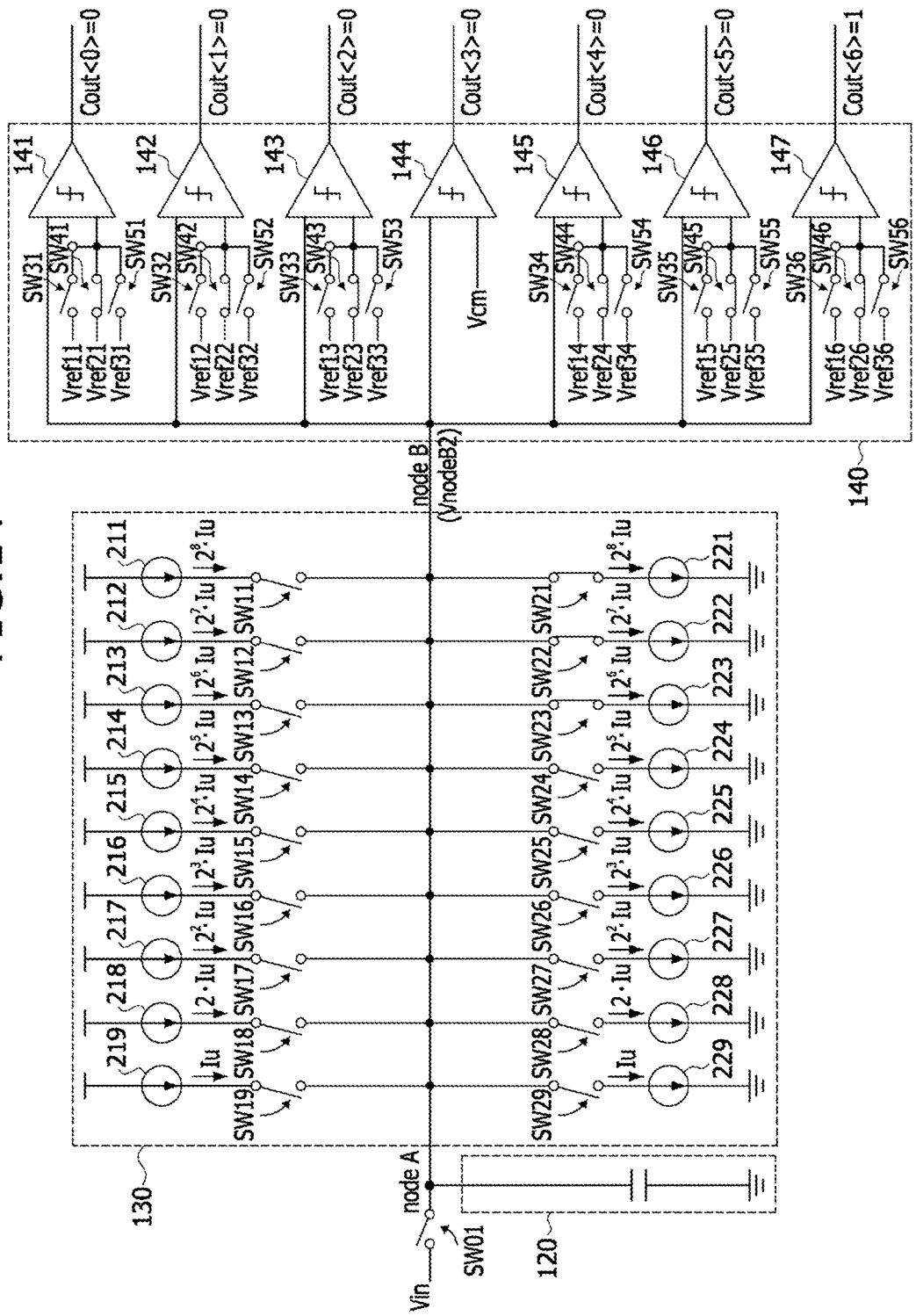
Figure 15:
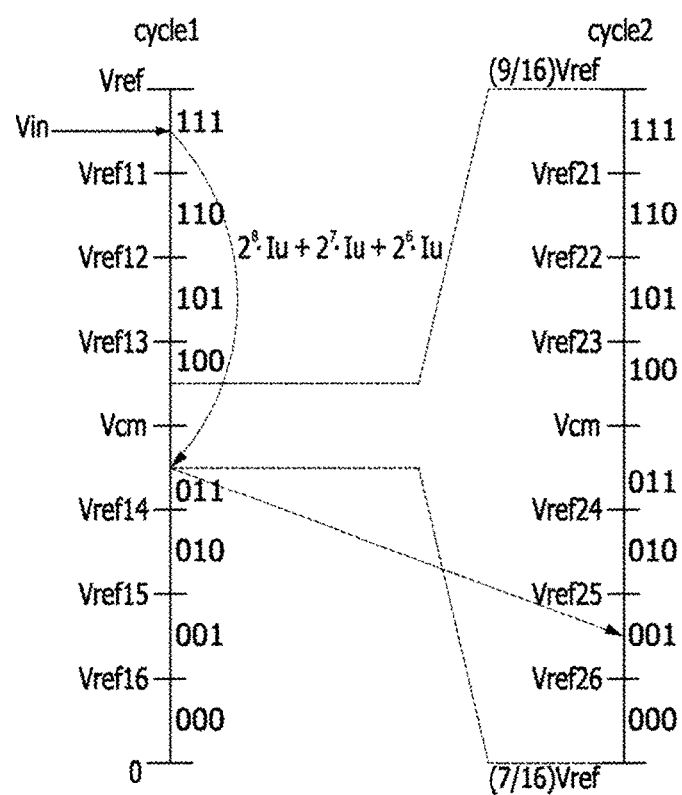

Referring to FIGS. 14 and 15, if the first clock cycle CYCLE1 ends, a third converting operation may be performed during the second clock cycle CYCLE2. First, while the output node voltage at the node NODE_B is the second output node voltage VnodeB2, the first to sixth switches SW31~SW36 of the first group of switches included in the comparison circuit 140 may be turned off and the first to sixth switches SW41~SW46 of the second group of switches included in the comparison circuit 140 may be turned on. In addition, the first to sixth switches SW51~SW56 of the third group of switches included in the comparison circuit 140 may be turned off. Thus, the node NODE_B may have the second output node voltage VnodeB2, and the second output node voltage VnodeB2 may be applied to the first input terminals of the first to seventh comparators 141~147. The first to third reference voltages Vref21~Vref23 included in the second group of reference voltages, the reference mid-voltage Vcm, and the fourth to sixth reference voltages Vref24~Vref26 included in the second group of reference voltages may be applied to the second input terminals of the first to seventh comparators 141~147, respectively. If the second output node voltage VnodeB2 has a voltage level between the fifth reference voltage Vref25 and the sixth reference voltage Vref26 included in the second group of reference voltages, the first to sixth comparators 141~146 may output the comparison output data Cout<0:5> having a logic "low(0)" level and the seventh comparator 147 may output the comparison output datum Cout<6> having a logic "high(1)" level. Accordingly, the comparison output data Cout<0:6> inputted to the decoder 150 may have a logic level combination of '0000001'. The decoder 150 may output the third binary output data having a logic level combination of '001' corresponding to the comparison output data Cout<0:6> having a logic level combination of '0000001', as listed in the table 1. The third binary output data having a logic level combination of '001' may constitute data of the fourth bit to the sixth bit included in the ten-bit digital output signal.

Figure 16:
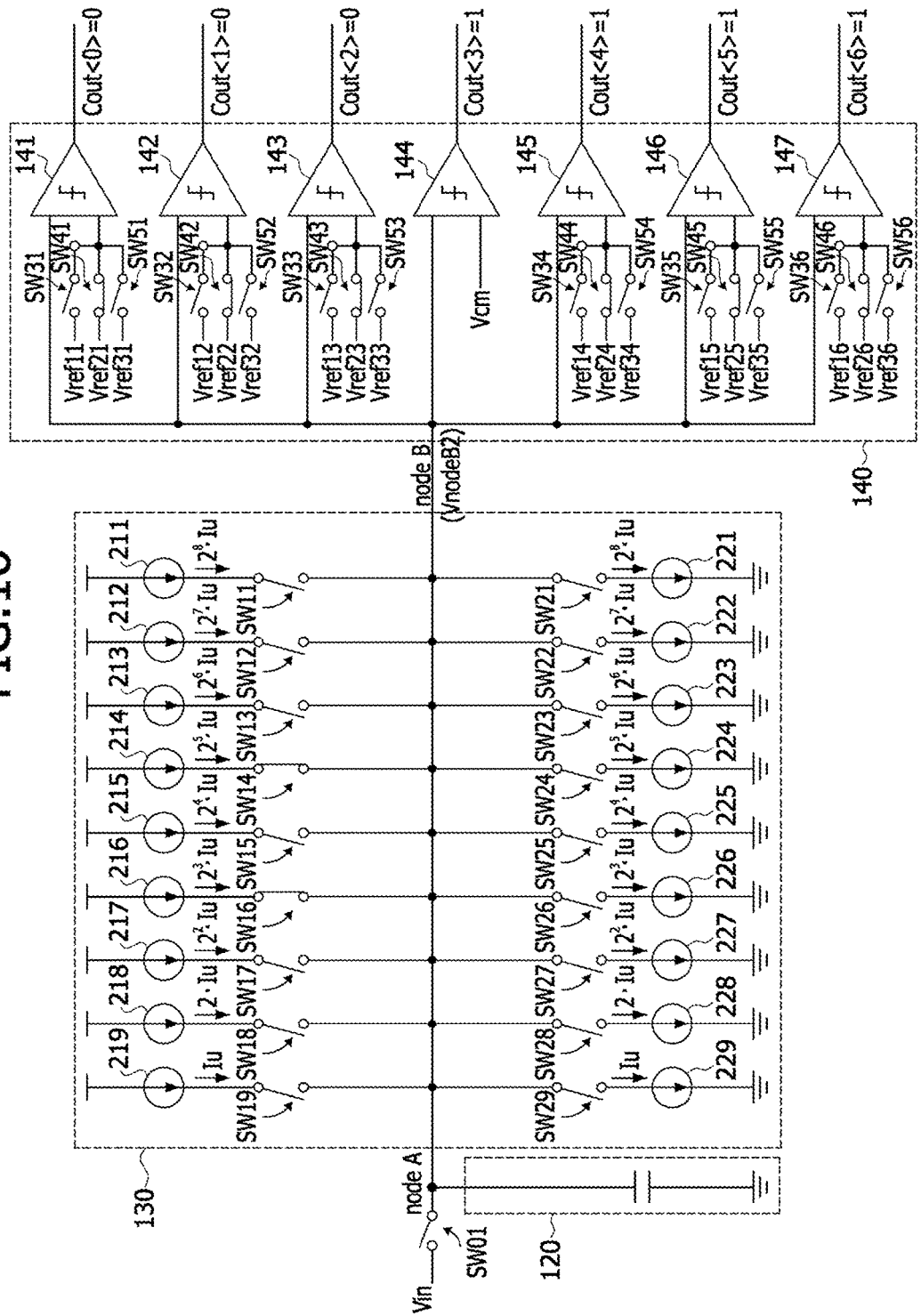
Figure 17:
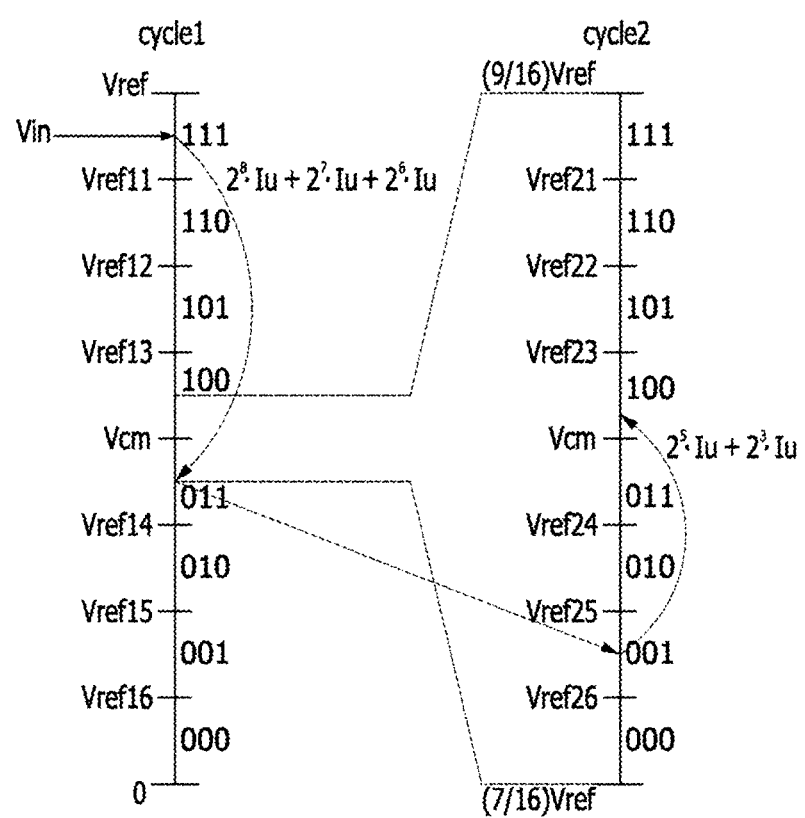

Referring to FIGS. 16 and 17, if the third binary output data having a logic level combination of '001' corresponding to the second output node voltage VnodeB2 are outputted from the decoder 150, a fourth converting operation may be performed during the second clock cycle CYCLE2. For example, some of the additive current steering sources 211~219 may be electrically connected to the node NODE_B to increase a voltage level of the node NODE_B. In order to increase the second output node voltage VnodeB2 in the voltage section corresponding to the third binary output data '001' to a voltage level close to the reference mid-voltage Vcm during the second clock cycle CYCLE2, it may be necessary to generate a current having an amount of "$2^5 \times Iu + 2^3 \times Iu$" flowing from the power supply voltage terminal toward the node NODE_B. In such a case, the second output node voltage VnodeB2 may be increased by 2.5 times a voltage range of the voltage section corresponding to the third binary output data '001'. In another embodiment, if the third binary output data having a logic level combination of '000' corresponding to the second output node voltage VnodeB2 are outputted from the decoder 150, it may be necessary to generate a current having an amount of "$2^5 \times Iu + 2^4 \times Iu + 2^3 \times Iu$" flowing from the power supply voltage terminal toward the node NODE_B. In such a case, the second output node voltage VnodeB2 may be increased by 3.5 times a voltage range of the voltage section corresponding to the third binary output data '000'. In yet another embodiment, if the third binary output data having a logic level combination of '010' corresponding to the second output node voltage VnodeB2 are outputted from the decoder 150, it may be necessary to generate a current having an amount of "$2^4 \times Iu + 2^3 \times Iu$" flowing from the power supply voltage terminal toward the node NODE_B. In such a case, the second output node voltage VnodeB2 may be increased by 1.5 times a voltage range of the voltage section corresponding to the third binary output data '010'. In still another embodiment, if the third binary output data having a logic level combination of '011' corresponding to the second output node voltage VnodeB2 are outputted from the decoder 150, it may be necessary to generate a current having an amount of "$2^3 \times Iu$" flowing from the power supply voltage terminal toward the node NODE_B. In such a case, the second output node voltage VnodeB2 may be increased by 0.5 times a voltage range of the voltage section corresponding to the third binary output data '011'. If the third binary output data having a logic level combination of '111', '110', '101' or '100' are outputted from the decoder 150, it may be necessary to generate an appropriate current flowing from the node NODE_B toward the ground voltage terminal using the subtractive current steering sources 221~229 instead of the additive current steering sources 211~219.

If the third binary output data '001' corresponding to the second output node voltage VnodeB2 are outputted from the decoder 150, the fourth and sixth additive switches SW14 and SW16 connected to the fourth and sixth additive current steering sources 214 and 216 may be turned on and the first to ninth subtractive switches SW21~SW29 and the remaining switches SW11~SW13, SW15 and SW17~SW19 may be turned off. Thus, a current having an amount of "$2^5 \times Iu + 2^3 \times Iu$" may flow from the power supply voltage terminal toward the node NODE_B, and the second output node voltage VnodeB2 at the node NODE_B may be increased to provide a third output node voltage VnodeB3 which is higher than the reference mid-voltage Vcm. If the third output node voltage VnodeB3 has a voltage level between the third reference voltage Vref23 and the reference mid-voltage Vcm, all of the first to third comparators 141~143 may output data having a logic "low(0)" level and all of the fourth to seventh comparators 144~147 may output data having a logic "high(1)" level. Accordingly, the comparison output data Cout<0:6> inputted to the decoder 150 may have a logic level combination of '0001111'. The decoder 150 may output the fourth binary output data having a logic level combination of '100' corresponding to the comparison output data Cout<0:6> having a logic level combination of '0001111', as listed in the table 1.

Figure 18:
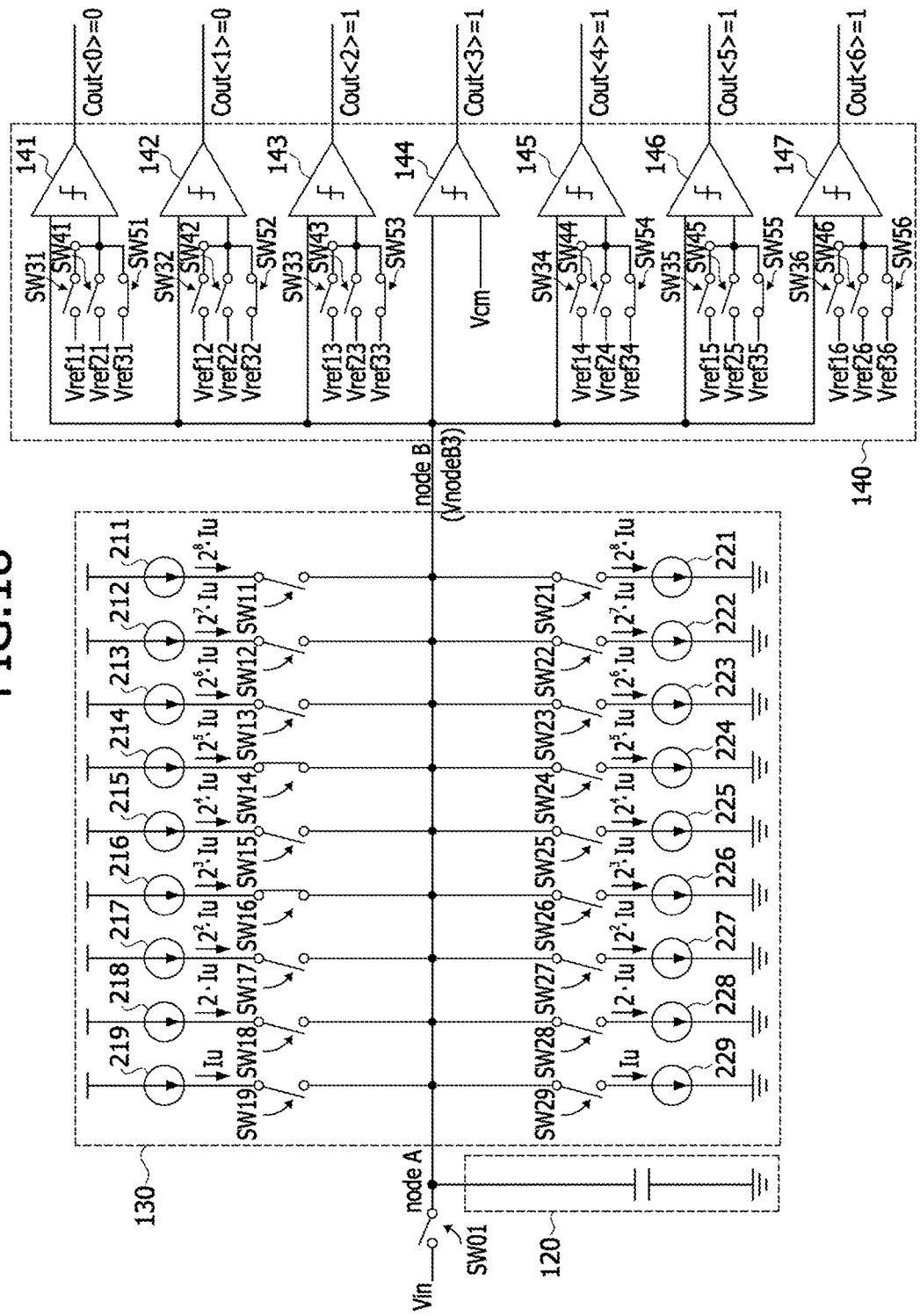
Figure 19:
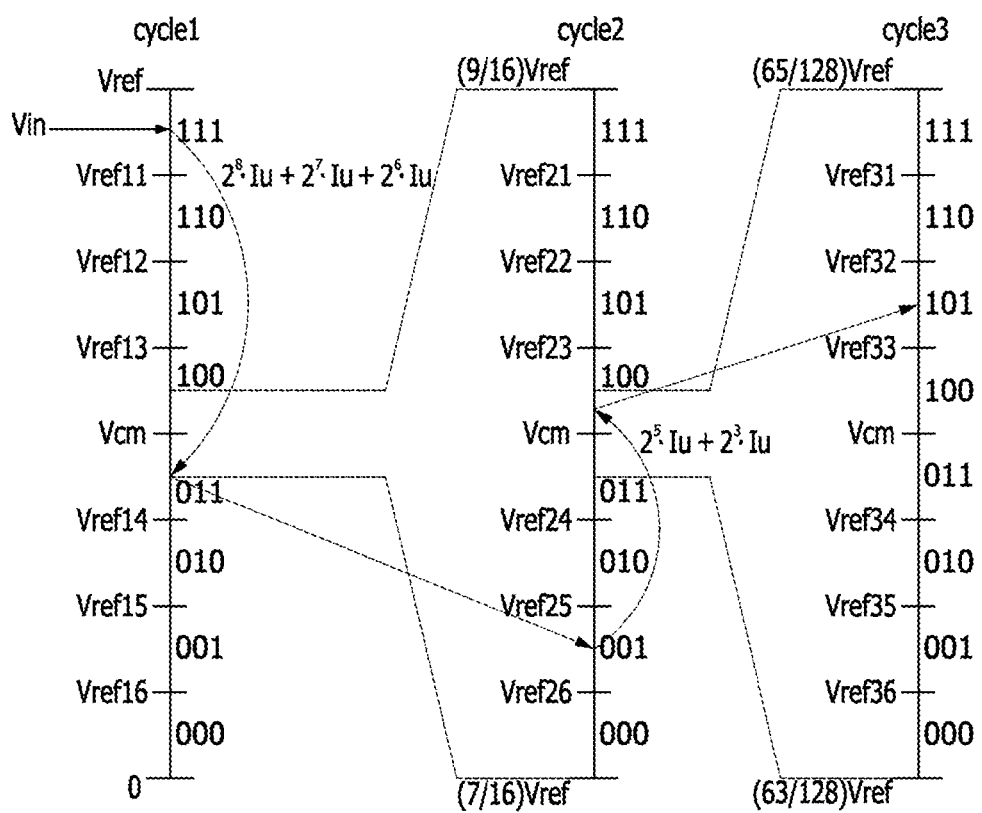

Referring to FIGS. 18 and 19, if the second clock cycle CYCLE2 ends, a fifth converting operation may be performed during the third clock cycle CYCLE3. First, while the output node voltage at the node NODE_B is the third output node voltage VnodeB3, the first to sixth switches SW31~SW36 and the first to sixth switches SW41~SW46 may be turned off and the first to sixth switches SW51~SW56 may be turned on. Thus, the node NODE_B may have the third output node voltage VnodeB3, and the third output node voltage VnodeB3 may be applied to the first input terminals of the first to seventh comparators 141~147. The first to third reference voltages Vref31~Vref33 included in the third group of reference voltages, the reference mid-voltage Vcm, and the fourth to sixth reference voltages Vref34~Vref36 included in the third group of reference voltages may be applied to the second input terminals of the first to seventh comparators 141~147, respectively. If the third output node voltage VnodeB3 has a voltage level between the second reference voltage Vref32 and the third reference voltage Vref33 included in the third group of reference voltages, the first and second comparators 141 and 142 may output the comparison output data Cout<0:1> having a logic "low(0)" level and the third to seventh comparators 143~147 may output the comparison output data Cout<2:6> having a logic "high(1)" level. Accordingly, the comparison output data Cout<0:6> inputted to the decoder 150 may have a logic level combination of '0011111'. The decoder 150 may output the fifth binary output data having a logic level combination of '101' corresponding to the comparison output data Cout<0:6> having a logic level combination of '0011111', as listed in the table 1. The fifth binary output data having a logic level combination of '101' may constitute data of the seventh bit to the ninth bit included in the ten-bit digital output signal.

Figure 20:
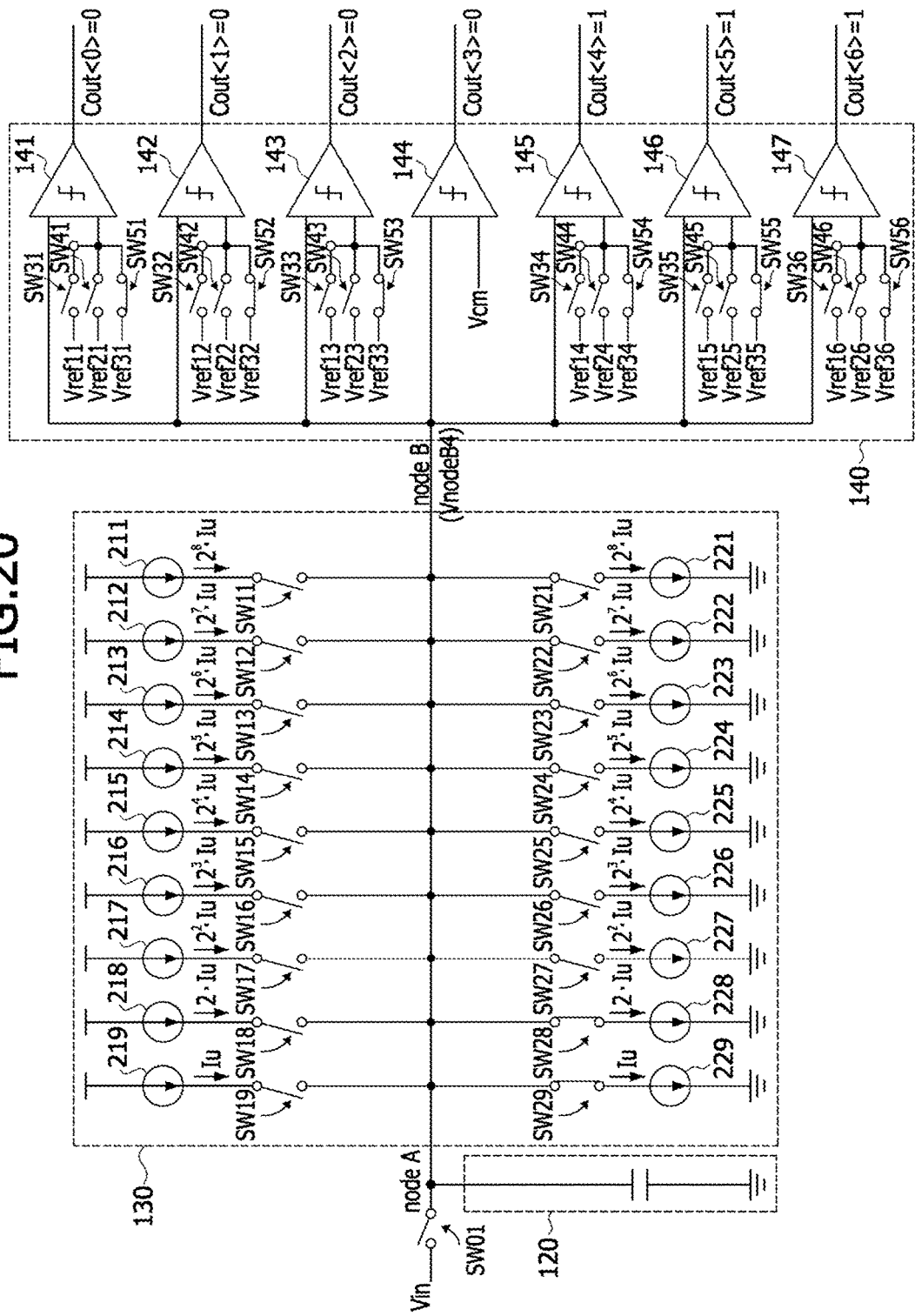
Figure 21:
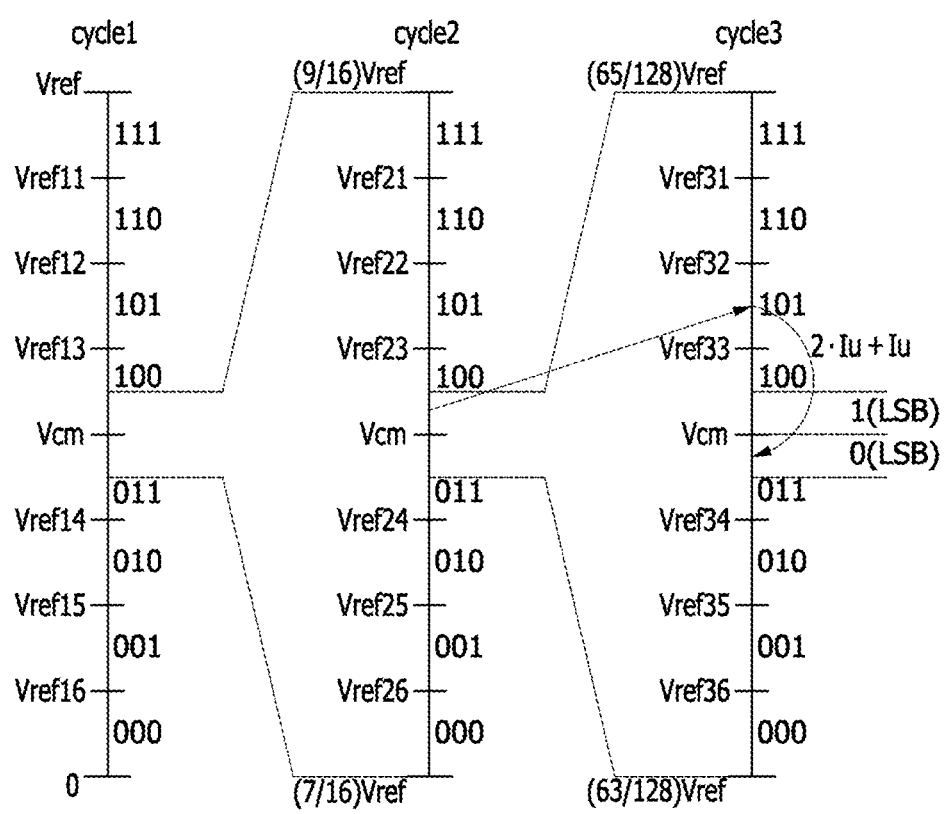

Referring to FIGS. 20 and 21, if the fifth binary output data having a logic level combination of '101' corresponding to the third output node voltage VnodeB3 are outputted from the decoder 150, a sixth converting operation may be performed during the third clock cycle CYCLE3. For example, some of the subtractive current steering sources 221~229 may be electrically connected to the node NODE_B to lower a voltage level of the node NODE_B. In order to lower the third output node voltage VnodeB3 in the voltage section corresponding to the fifth binary output data '101' to a voltage level close to the reference mid-voltage Vcm during the third clock cycle CYCLE3, it may be necessary to generate a current having an amount of "$2 \times Iu + Iu$" flowing from the node NODE_B toward the ground voltage terminal. In such a case, the third output node voltage VnodeB3 may be lowered by 1.5 times a voltage range of the voltage section corresponding to the fifth binary output data '101'. In another embodiment, if the fifth binary output data having a logic level combination of '111' corresponding to the third output node voltage VnodeB3 are outputted from the decoder 150, it may be necessary to generate a current having an amount of "$2^2 \times Iu+2 \times Iu+Iu$" flowing from the node NODE_B toward the ground voltage terminal. In such a case, the third output node voltage VnodeB3 may be lowered by 3.5 times a voltage range of the voltage section corresponding to the fifth binary output data '111'. In yet another embodiment, if the fifth binary output data having a logic level combination of '110' corresponding to the third output node voltage VnodeB3 are outputted from the decoder 150, it may be necessary to generate a current having an amount of "$2^2 \times Iu+Iu$" flowing from the node NODE_B toward the ground voltage terminal. In such a case, the third output node voltage VnodeB3 may be lowered by 2.5 times a voltage range of the voltage section corresponding to the fifth binary output data '110'. In still another embodiment, if the fifth binary output data having a logic level combination of '100' corresponding to the third output node voltage VnodeB3 are outputted from the decoder 150, it may be necessary to generate the unit current Iu flowing from the node NODE_B toward the ground voltage terminal. In such a case, the third output node voltage VnodeB3 may be lowered by 0.5 times a voltage range of the voltage section corresponding to the fifth binary output data '100'. If the fifth binary output data having a logic level combination of '000', '001', '010' or '011' are outputted from the decoder 150, it may be necessary to generate an appropriate current flowing from the power supply voltage terminal toward the node NODE_B using the additive current steering sources 211~219 instead of the subtractive current steering sources 221~229.

If the fifth binary output data '101' corresponding to the third output node voltage VnodeB3 are outputted from the decoder 150, the eighth and ninth subtractive switches SW28 and SW29 connected to the eighth and ninth subtractive current steering sources 228 and 229 may be turned on and the first to seventh subtractive switches SW21~SW27 and the first to ninth additive switches SW11~SW19 may be turned off. Thus, a current having an amount of "$2 \times Iu+Iu$" may flow from the node NODE_B toward the ground voltage terminal, and the third output node voltage VnodeB3 at the node NODE_B may be lowered to provide a fourth output node voltage VnodeB4 which is lower than the reference mid-voltage Vcm. If the fourth output node voltage VnodeB4 has a voltage level between the reference mid-voltage Vcm and the fourth reference voltage Vref34, all of the first to fourth comparators 141~144 may output data having a logic "low(0)" level and all of the fifth to seventh comparators 145~147 may output data having a logic "high(1)" level. Accordingly, the comparison output data Cout<0:6> inputted to the decoder 150 may have a logic level combination of '0000111'. The decoder 150 may output the sixth binary output data having a logic level combination of '011' corresponding to the comparison output data Cout<0:6> having a logic level combination of '0000111', as listed in the table 1.

As a result of the operation described above, the first bit (i.e., the MSB) to the ninth bit included in the ten-bit digital output data may have a logic level combination of '111001101'. The tenth bit (i.e., the LSB) of the ten-bit digital output data may be determined to have a logic "low(0)" level because the sixth binary output data corresponding to the fourth output node voltage VnodeB4 have a logic level combination of '011'. In another embodiment, if the sixth binary output data corresponding to the fourth output node voltage VnodeB4 have a logic level combination of '100', the tenth bit (i.e., the LSB) of the ten-bit digital output data may be determined to have a logic "high(1)" level.

Figure 22:
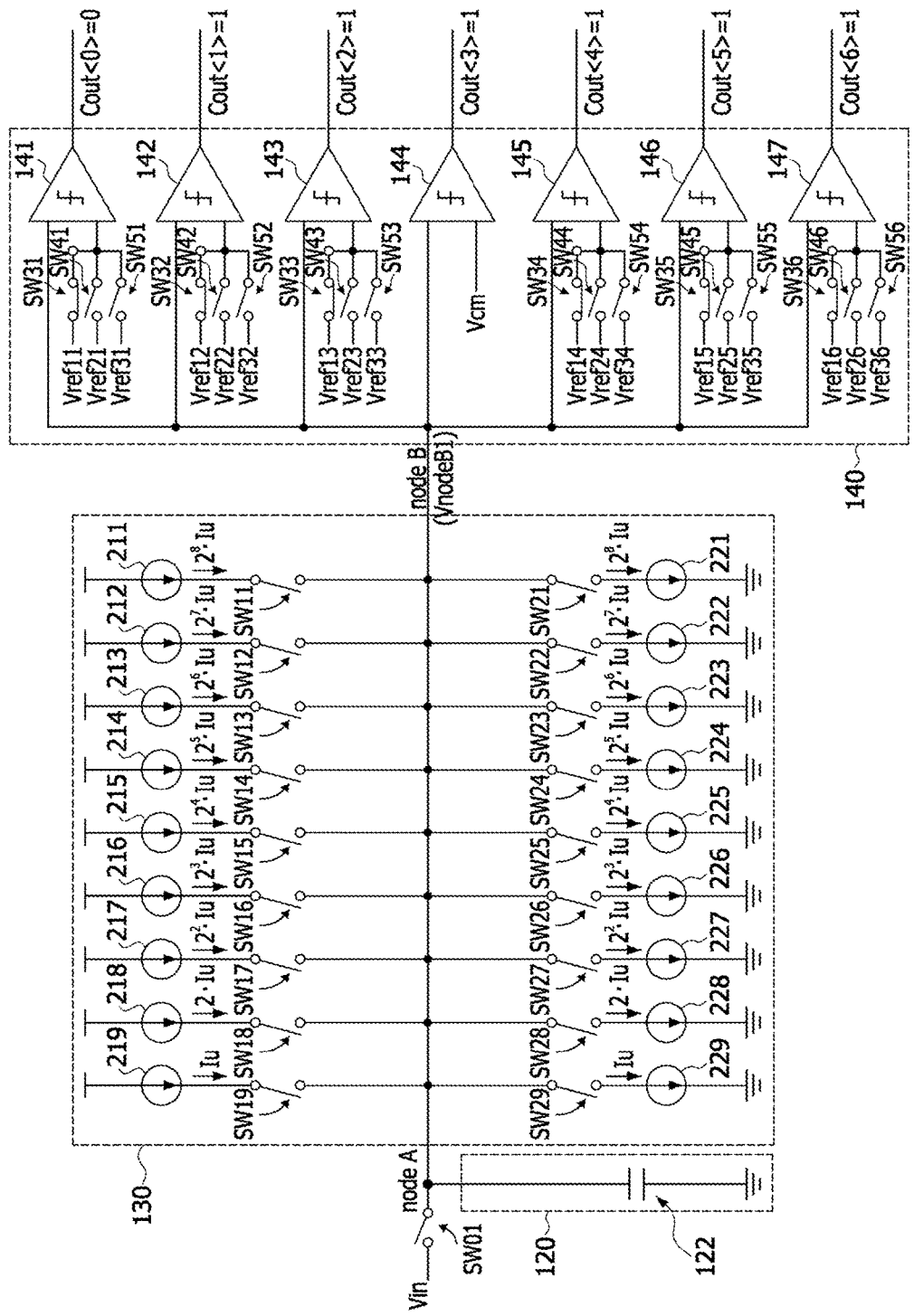
FIGS. 22 to 35 illustrate other examples of an operation of a current steering analog-to-digital converter according to embodiments of the present disclosure.
Figure 23:
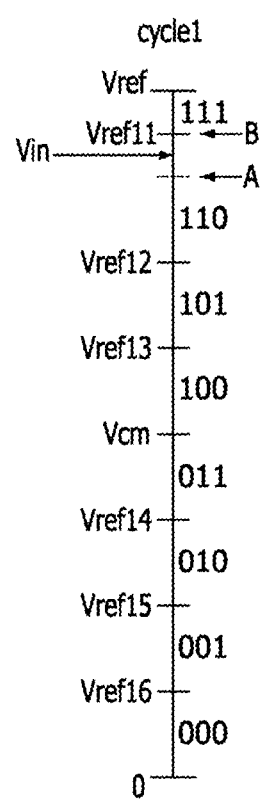

FIGS. 22 to 35 illustrate other examples of an operation of the current steering analog-to-digital converter 100 according to embodiments of the present disclosure. In FIGS. 22 to 35, the same reference numerals or the same reference designators as used in FIG. 2 denote the same elements. First, a sampling step may be executed using the same manner as described with reference to FIG. 9. Next, referring to FIGS. 22 and 23, a first converting operation may be performed during the first clock cycle CYCLE1 after the sampling step terminates. For example, while the sampling capacitor 122 is turned off, the first to sixth switches SW31~SW36 of the first group of switches included in the comparison circuit 140 may be turned on. In such a case, the first to ninth additive switches SW11~SW19 and the first to ninth subtractive switches SW21~SW29 in the current driving circuit 130 may be turned off, and the first to sixth switches SW41~SW46 of the second group of switches and the first to sixth switches SW51~SW56 of the third group of switches in the comparison circuit 140 may also be turned off. Thus, the output node voltage at the node NODE_B may be a first output node voltage VnodeB1 which is equal to the input voltage Vin, and the first output node voltage VnodeB1 may be applied to the first input terminals of the first to seventh comparators 141~147. The first to third reference voltages Vref11~Vref13 included in the first group of reference voltages, the reference mid-voltage Vcm, and the fourth to sixth reference voltages Vref14~Vref16 included in the first group of reference voltages may be applied to the second input terminals of the first to seventh comparators 141~147, respectively. If the first output node voltage VnodeB1 has a voltage level between the maximum reference voltage Vref and the first reference voltage Vref11, all of the first to seventh comparators 141~147 have to output the comparison output data Cout<0:6> having a logic "high (1)" level. That is, the comparison output data Cout<0:6> inputted to the decoder 150 may have a logic level combination of '1111111', and the decoder 150 may output the first binary output data having a logic level combination of '111' corresponding to the comparison output data Cout<0:6> having a logic level combination of '1111111'. However, as illustrated in FIG. 23, if the first reference voltage Vref11 of the first group of reference voltages is shifted from an original normal level "A" to an abnormal level "B" due to a mismatch occurrence, the first binary output data corresponding to the first output node voltage VnodeB1 may be generated to have a logic level combination of '110' instead of '111'.

Figure 24:
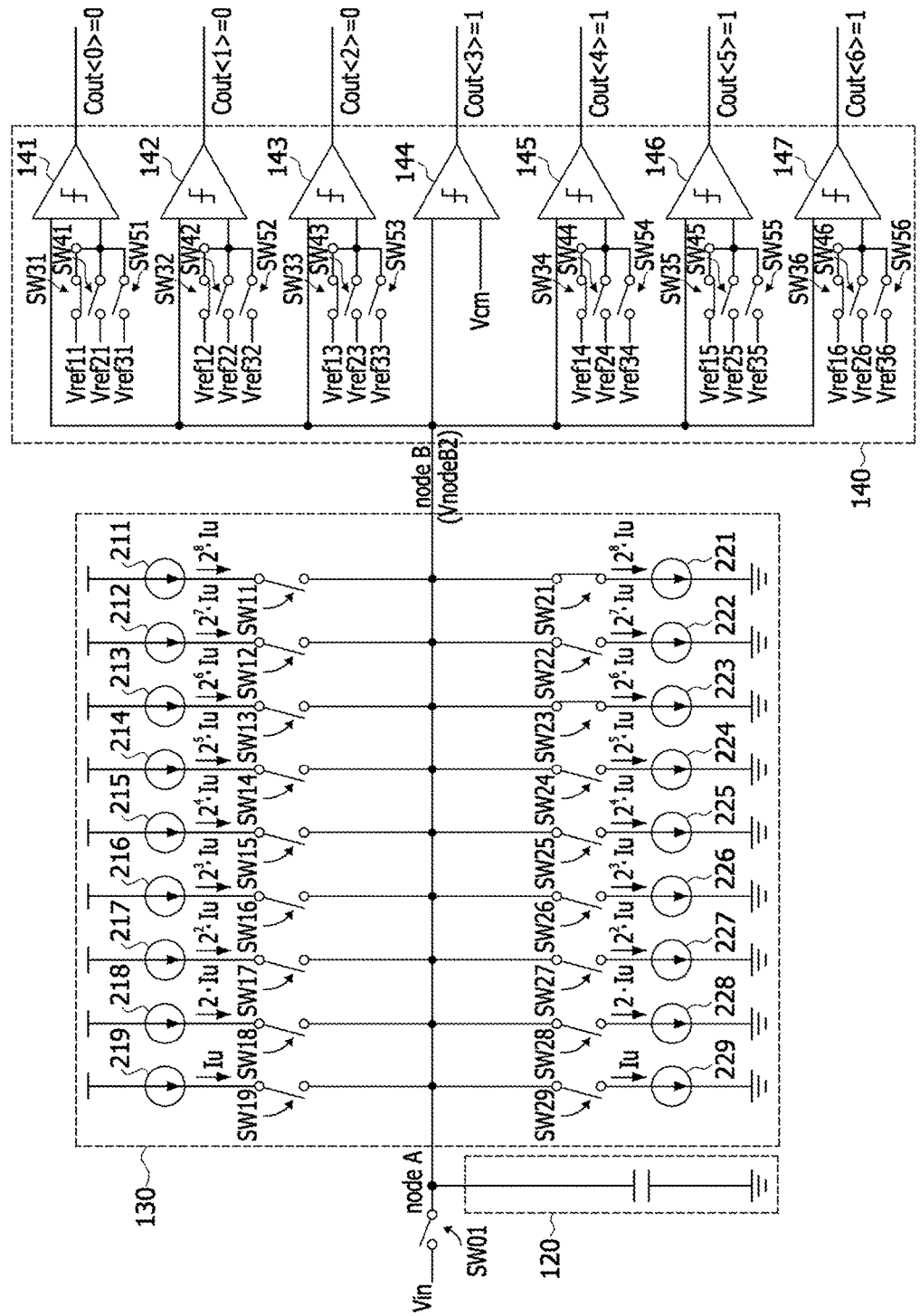
Figure 25:
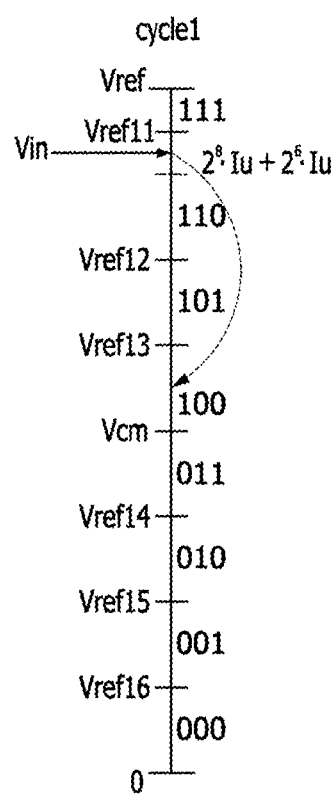

Referring to FIGS. 24 and 25, if the first binary output data having a logic level combination of '110' corresponding to the first output node voltage VnodeB1 are outputted from the decoder 150, a second converting operation may be performed during the first clock cycle CYCLE1. Hereinafter, the following converting operations will be described in conjunction with an example in which the first output node voltage VnodeB1 is closer to the original normal level "A" of the first reference voltage Vref11 rather than the maximum reference voltage Vref. For example, some of the subtractive current steering sources 221~229 may be electrically connected to the node NODE_B to lower a voltage level of the node NODE_B. In order to lower the first output node voltage VnodeB1 in the voltage section corresponding to the first binary output data '110' to a voltage level close to the reference mid-voltage Vcm during the first clock cycle CYCLE1, it may be necessary to generate a current having an amount of "$2^8 \times Iu + 2^6 \times Iu$" flowing from the node NODE_B toward the ground voltage terminal. In such a case, the first output node voltage VnodeB1 may be lowered by 2.5 times a voltage range of the voltage section corresponding to the first binary output data '110'.

Since the first binary output data '110' corresponding to the first output node voltage VnodeB1 are outputted from the decoder 150, the first and third subtractive switches SW21 and SW23 connected to the first and third subtractive current steering sources 221 and 223 may be turned on and the first to ninth additive switches SW11~SW19 as well as the second subtractive switch SW22 and the fourth to ninth subtractive switches SW24~SW29 may be turned off. Thus, a current having an amount of "$2^8 \times Iu + 2^6 \times Iu$" may flow from the node NODE_B toward the ground voltage terminal, and the first output node voltage VnodeB1 at the node NODE_B may be lowered to provide a second output node voltage VnodeB2 having a voltage level between the third reference voltage Vref13 and the reference mid-voltage Vcm. In such a case, all of the first to third comparators 141~143 may output data having a logic "low(0)" level and all of the fourth to seventh comparators 144~147 may output data having a logic "high(1)" level. Accordingly, the comparison output data Cout<0:6> inputted to the decoder 150 may have a logic level combination of '0001111'. The decoder 150 may output the second binary output data having a logic level combination of '100' corresponding to the comparison output data Cout<0:6> having a logic level combination of '0001111', as listed in the table 1.

Figure 26:
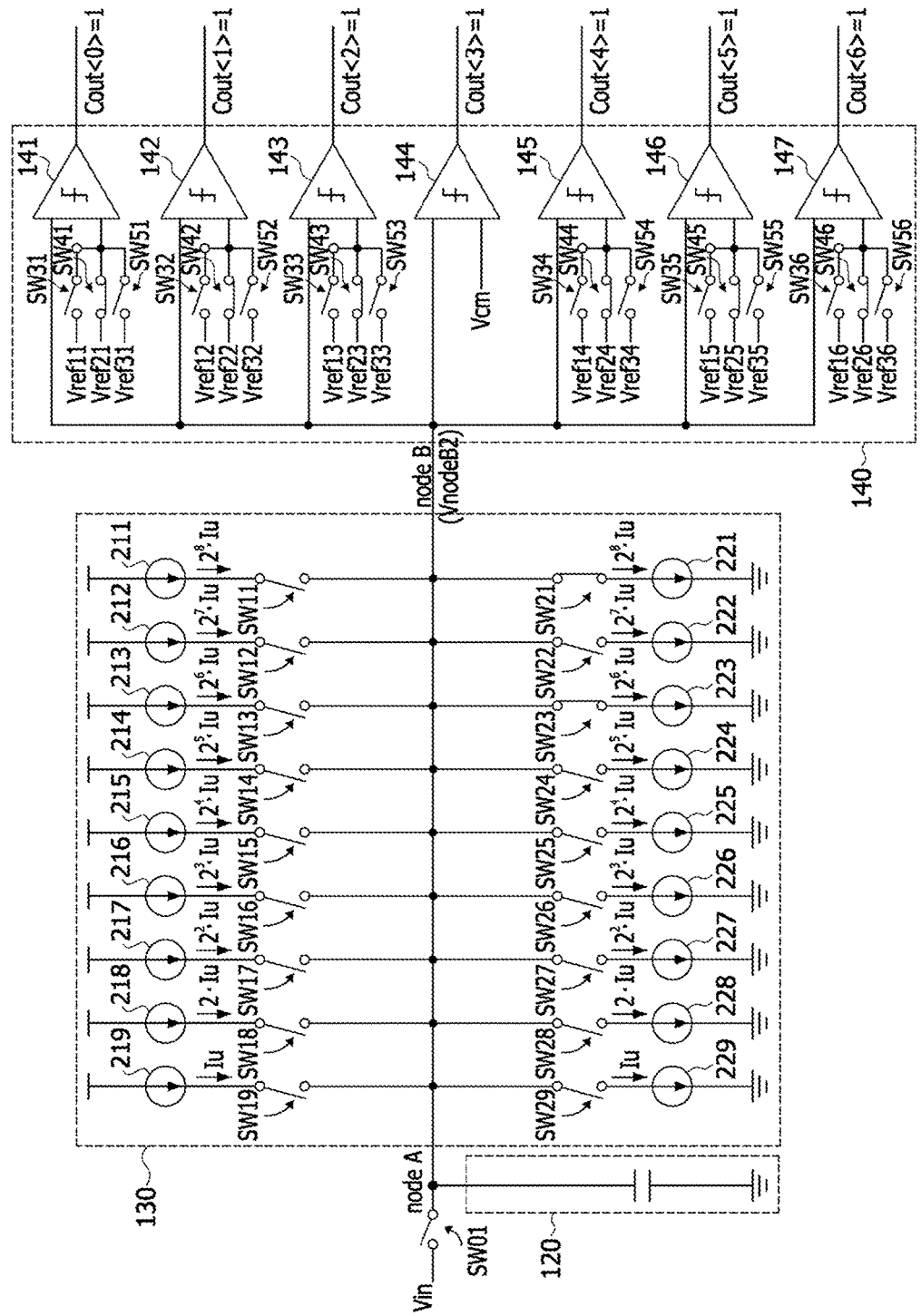
Figure 27:
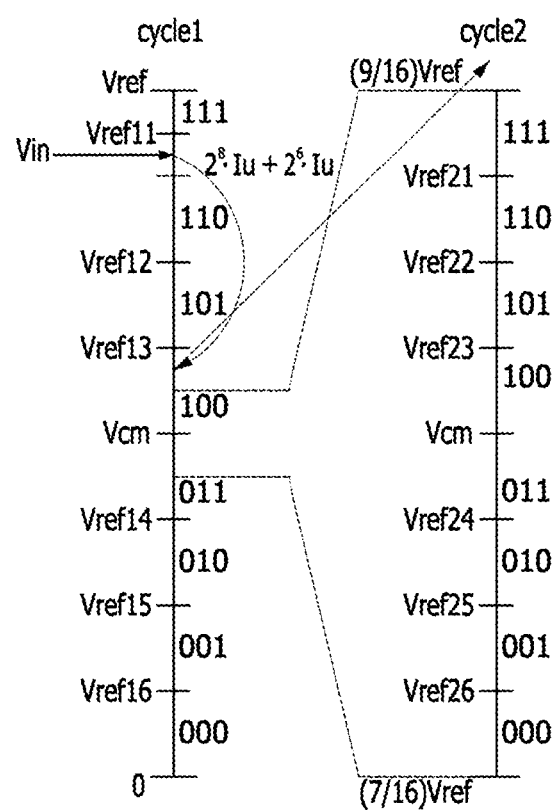

Referring to FIGS. 26 and 27, if the first clock cycle CYCLE1 ends, a third converting operation may be performed during the second clock cycle CYCLE2. First, while the output node voltage at the node NODE_B is the second output node voltage VnodeB2, the first to sixth switches SW31~SW36 of the first group of switches included in the comparison circuit 140 may be turned off and the first to sixth switches SW41~SW46 of the second group of switches included in the comparison circuit 140 may be turned on. In addition, the first to sixth switches SW51~SW56 of the third group of switches included in the comparison circuit 140 may be turned off. Thus, the node NODE_B may have the second output node voltage VnodeB2, and the second output node voltage VnodeB2 may be applied to the first input terminals of the first to seventh comparators 141~147. The first to third reference voltages Vref21~Vref23 included in the second group of reference voltages, the reference mid-voltage Vcm, and the fourth to sixth reference voltages Vref24~Vref26 included in the second group of reference voltages may be applied to the second input terminals of the first to seventh comparators 141~147, respectively. Since the second output node voltage VnodeB2 is higher than all of the second group of reference voltages Vref21~Vref26, all of the first to seventh comparators 141~147 may output the comparison output data Cout<0:6> having a logic "high(1)" level. Accordingly, the comparison output data Cout<0:6> inputted to the decoder 150 may have a logic level combination of '1111111'. The decoder 150 may output the third binary output data having a logic level combination of '111' corresponding to the comparison output data Cout<0:6> having a logic level combination of '1111111', as listed in the table 1.

Figure 28:
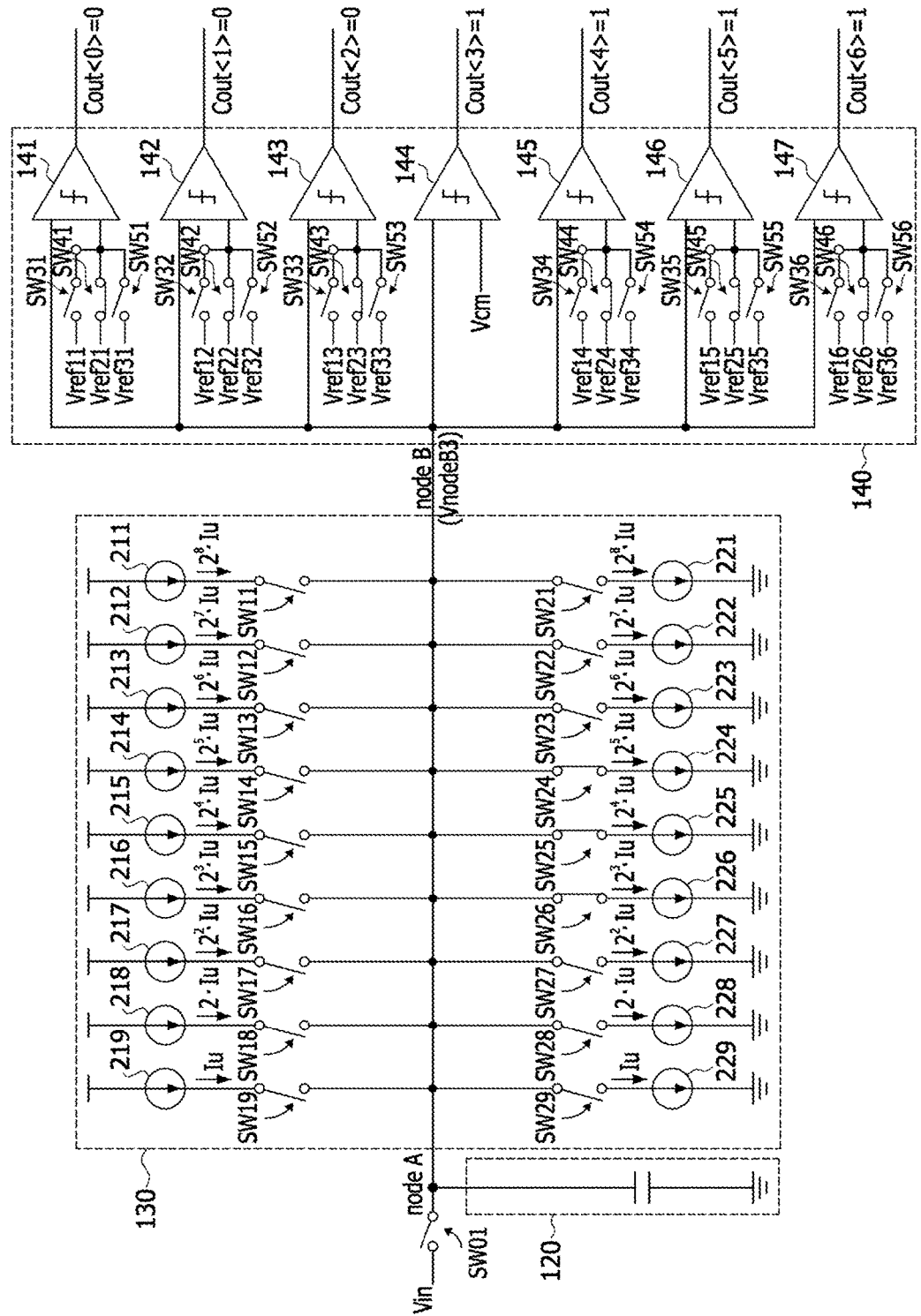
Figure 29:
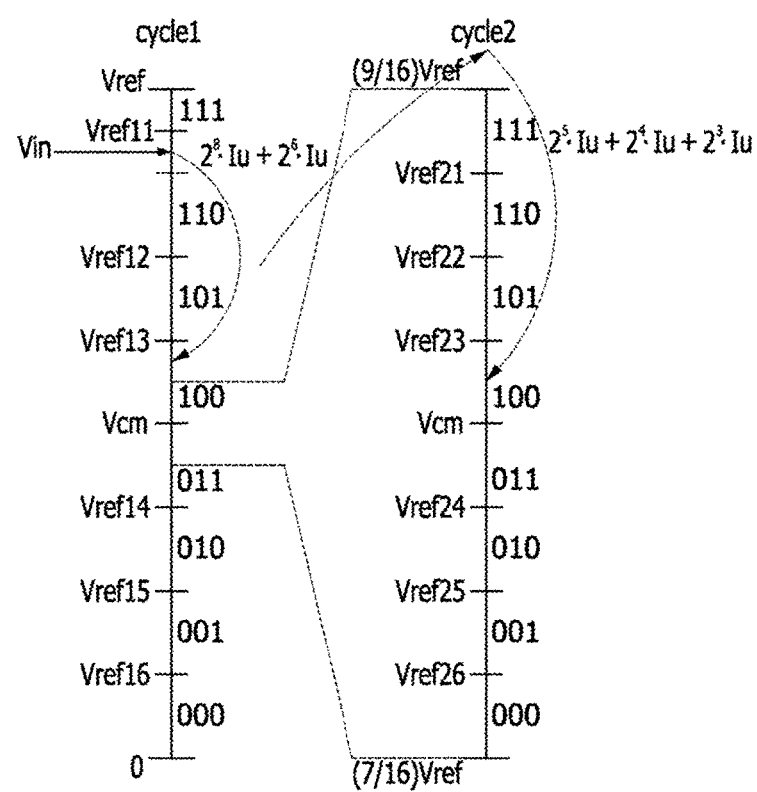

Referring to FIGS. 28 and 29, if the third binary output data having a logic level combination of '111' corresponding to the second output node voltage VnodeB2 are outputted from the decoder 150, a fourth converting operation may be performed during the second clock cycle CYCLE2. For example, the fourth to sixth subtractive switches SW24~SW26 connected to the fourth to sixth subtractive current steering sources 224~226 may be turned on, while the first to ninth additive switches SW11~SW19, the first to third subtractive switches SW21~SW23 and the seventh to ninth subtractive switches SW27~SW29 are turned off. Thus, a current having an amount of "$2^5 \times Iu + 2^4 \times Iu + 2^3 \times Iu$" may flow from the node NODE_B toward the ground voltage terminal. In such a case, the second output node voltage VnodeB2 at the node NODE_B may be lowered by 3.5 times a voltage range of the voltage section corresponding to the fourth binary output data '111', thereby providing a third output node voltage VnodeB3 having a voltage level between the third reference voltage Vref23 and the reference mid-voltage Vcm. Since the third output node voltage VnodeB3 has a voltage level between the third reference voltage Vref23 and the reference mid-voltage Vcm, all of the first to third comparators 141~143 may output data having a logic "low(0)" level and all of the fourth to seventh comparators 144~147 may output data having a logic "high (1)" level. Accordingly, the comparison output data Cout<0:6> inputted to the decoder 150 may have a logic level combination of '0001111'. The decoder 150 may output the fourth binary output data having a logic level combination of '100' corresponding to the comparison output data Cout<0:6> having a logic level combination of '0001111', as listed in the table 1.

Figure 30:
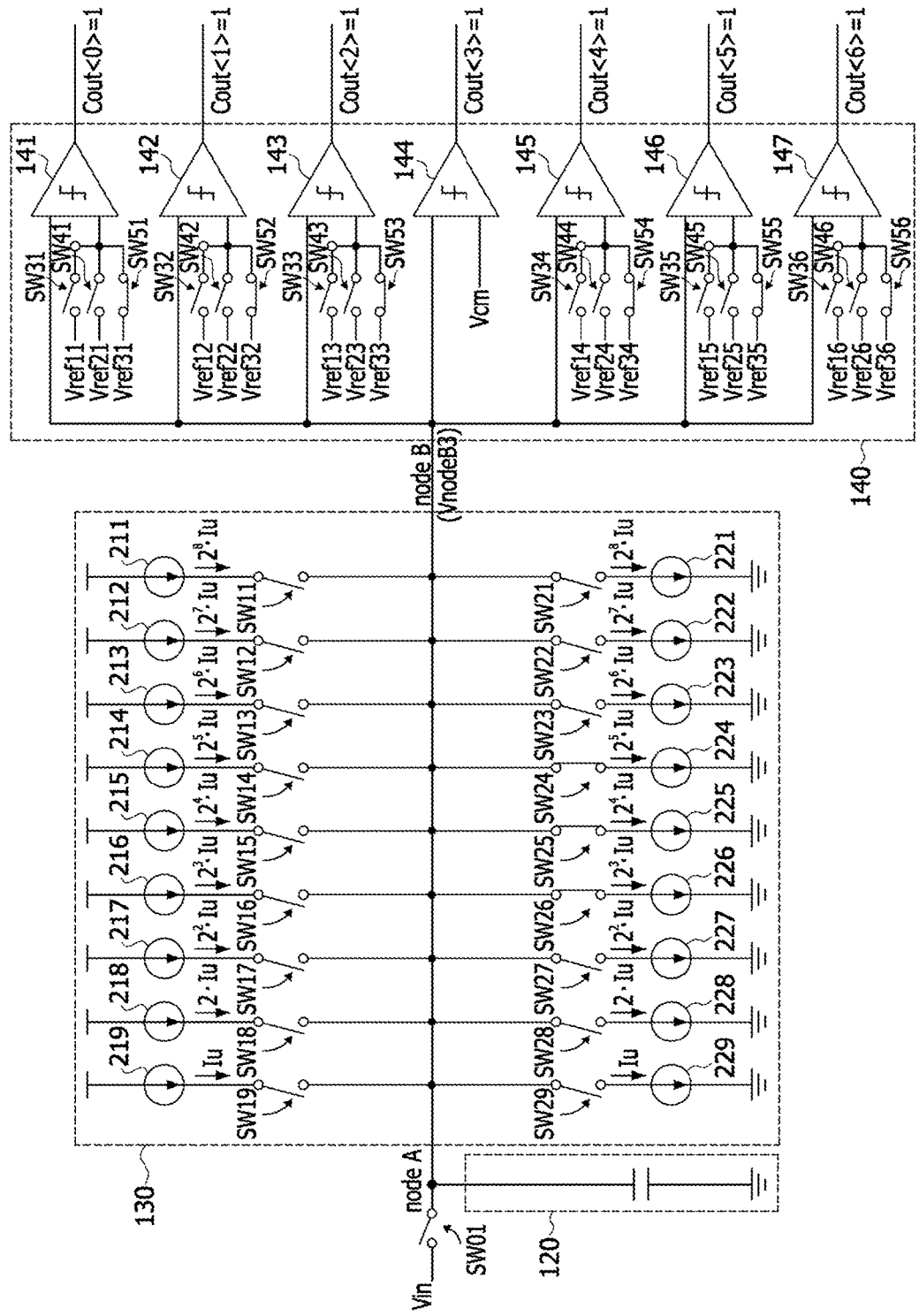
Figure 31:
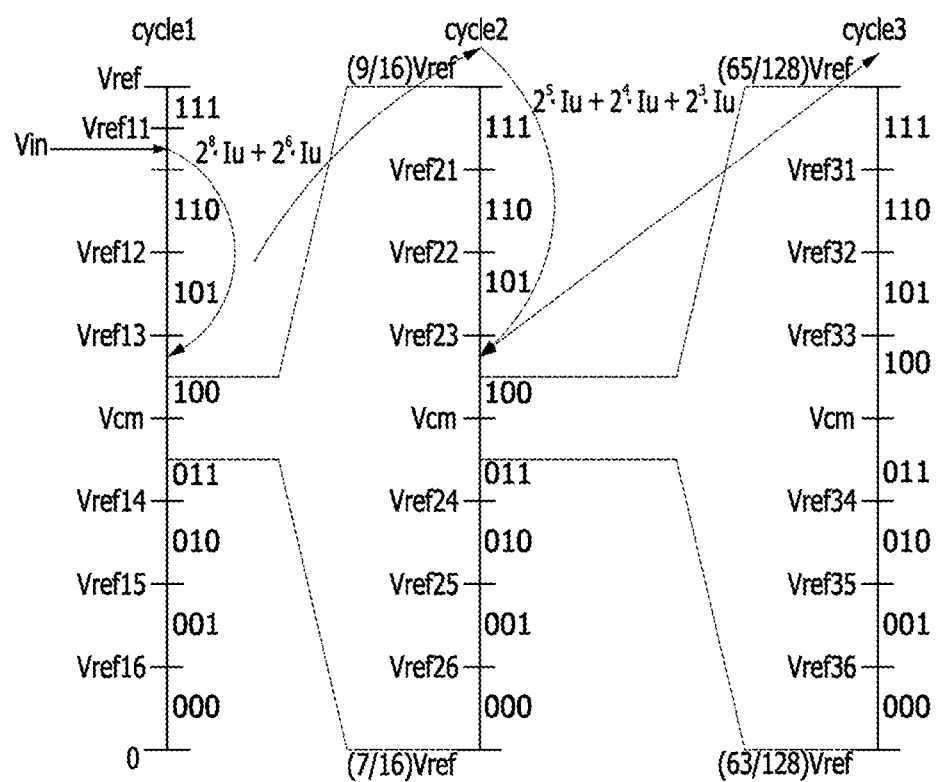

Referring to FIGS. 30 and 31, if the second clock cycle CYCLE2 ends, a fifth converting operation may be performed during the third clock cycle CYCLE3. First, while the output node voltage at the node NODE_B is the third output node voltage VnodeB3, the first to sixth switches SW31~SW36 and the first to sixth switches SW41~SW46 may be turned off and the first to sixth switches SW51~SW56 may be turned on. Thus, the node NODE_B may still have the third output node voltage VnodeB3, and the third output node voltage VnodeB3 may be applied to the first input terminals of the first to seventh comparators 141~147. The first to third reference voltages Vref31~Vref33 included in the third group of reference voltages, the reference mid-voltage Vcm, and the fourth to sixth reference voltages Vref34~Vref36 included in the third group of reference voltages may be applied to the second input terminals of the first to seventh comparators 141~147, respectively. Since the third output node voltage VnodeB3 is higher than all of the third group of reference voltages (i.e., the first to sixth reference voltages Vref31~Vref36), all of the first and seventh comparators 141~147 may output the comparison output data Cout<0:6> having a logic "high(1)" level. Accordingly, the comparison output data Cout<0:6> inputted to the decoder 150 may have a logic level combination of '1111111'. The decoder 150 may output the fifth binary output data having a logic level combination of '111' corresponding to the comparison output data Cout<0:6> having a logic level combination of '1111111', as listed in the table 1.

Figure 32:
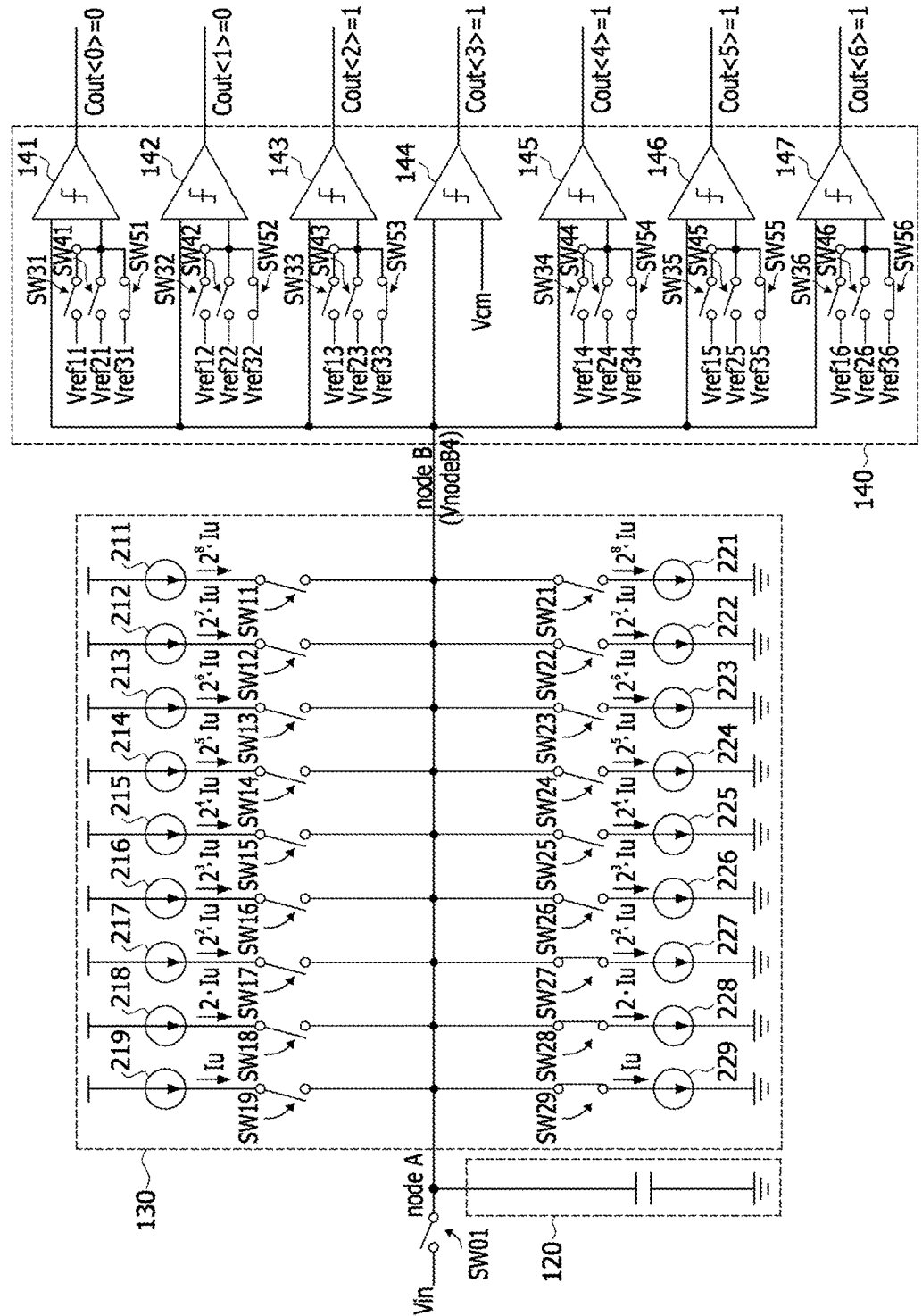
Figure 33:
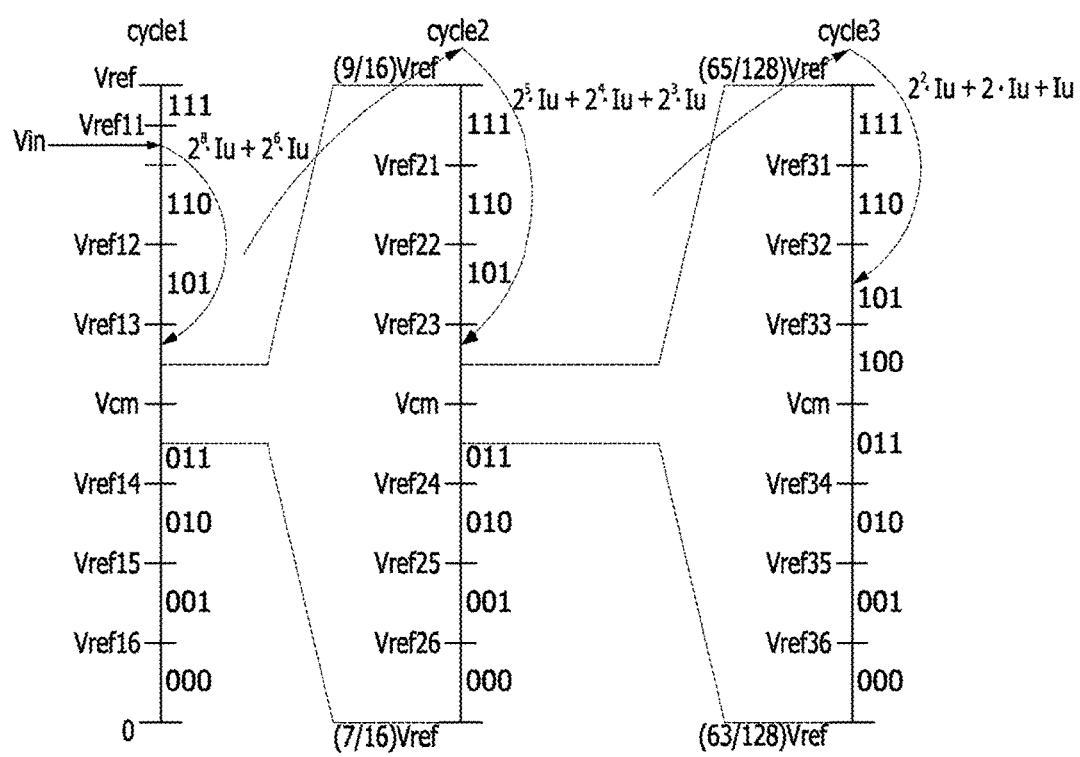

Referring to FIGS. 32 and 33, if the fifth binary output data having a logic level combination of '111' corresponding to the third output node voltage VnodeB3 are outputted from the decoder 150, a sixth converting operation may be performed during the third clock cycle CYCLE3. For example, the seventh to ninth subtractive switches SW27~SW29 connected to the seventh to ninth subtractive current steering sources 227~229 may be turned on, while the first to ninth additive switches SW11~SW19 and the first to sixth subtractive switches SW21~SW26 are turned off. Thus, a current having an amount of "$2^2 \times Iu + 2 \times Iu + Iu$" may flow from the node NODE_B toward the ground voltage terminal. In such a case, the third output node voltage VnodeB3 at the node NODE_B may be lowered by 3.5 times a voltage range of the voltage section corresponding to the fifth binary output data '111', thereby providing a fourth output node voltage VnodeB4 having a voltage level between the second reference voltage Vref32 and the third reference voltage Vref33. Since the fourth output node voltage VnodeB4 has a voltage level between the second reference voltage Vref32 and the third reference voltage Vref33, the first and second comparators 141 and 142 may output data having a logic "low(0)" level and the third to seventh comparators 143~147 may output data having a logic "high(1)" level. Accordingly, the comparison output data Cout<0:6> inputted to the decoder 150 may have a logic level combination of '0011111'. The decoder 150 may output the sixth binary output data having a logic level combination of '101' corresponding to the comparison output data Cout<0:6> having a logic level combination of '0011111', as listed in the table 1.

Figure 34:
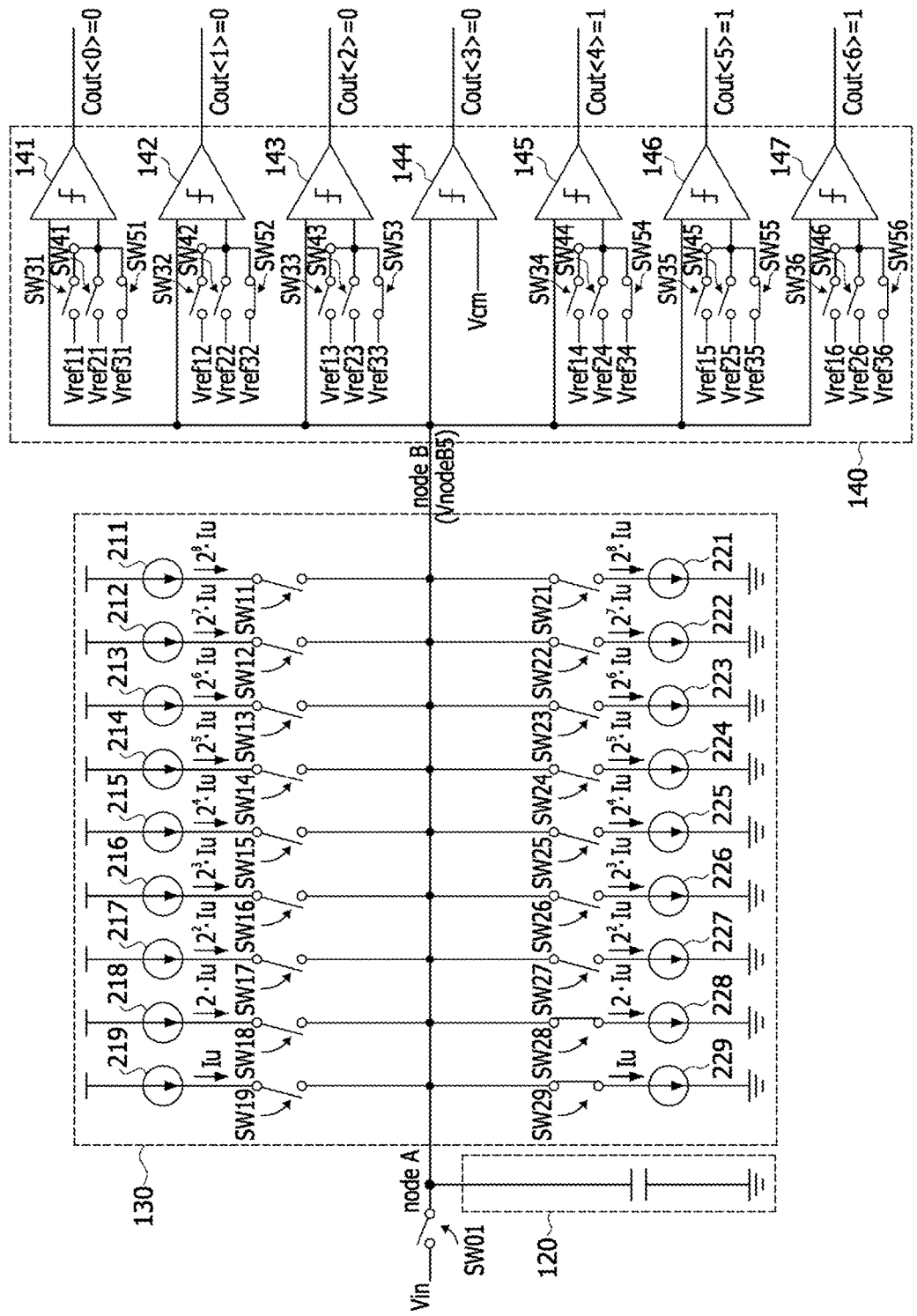
Figure 35:
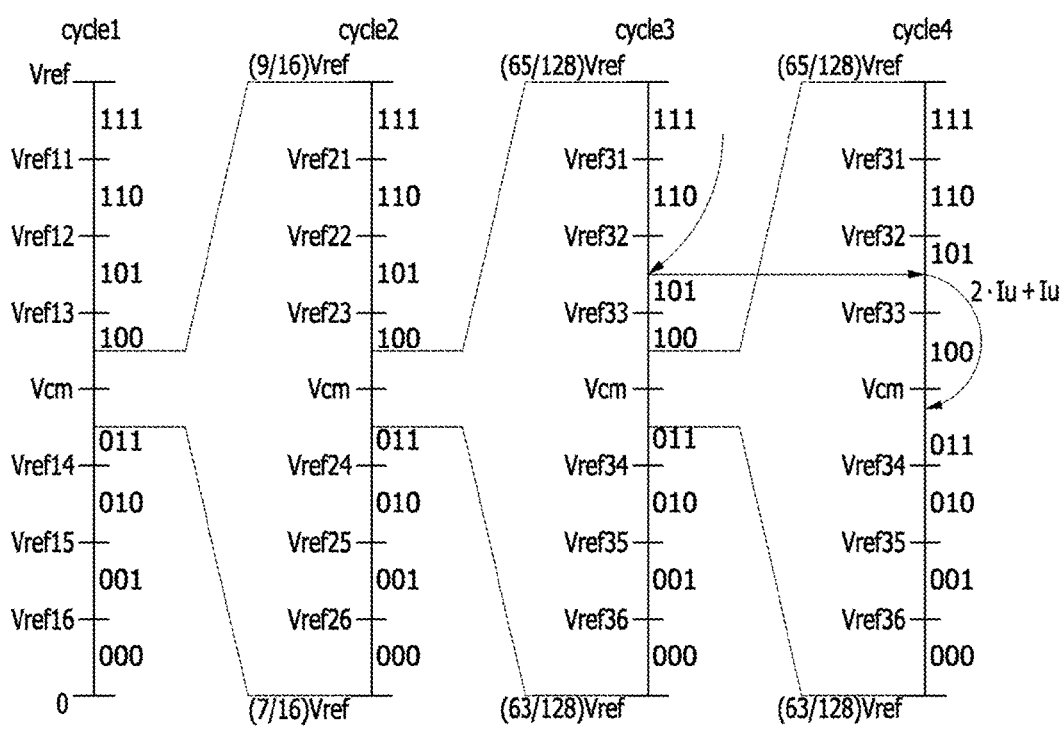

Referring to FIGS. 34 and 35, since the sixth binary output data do not have a logic level combination of '100' or '011', a mismatch correction step may be performed during the fourth clock cycle CYCLE4. For example, since the sixth binary output data '101' corresponding to the fourth output node voltage VnodeB4 are outputted from the decoder 150, the eighth and ninth subtractive switches SW28 and SW29 connected to the eighth and ninth subtractive current steering sources 228 and 229 may be turned on and the first to seventh subtractive switches SW21~SW27 and the first to ninth additive switches SW11~SW19 may be turned off. Thus, a current having an amount of "2×Iu+Iu" may flow from the node NODE_B toward the ground voltage terminal, and the fourth output node voltage VnodeB4 at the node NODE_B may be lowered by 1.5 times a voltage range of the voltage section corresponding to the sixth binary output data '101', thereby providing a fifth output node voltage VnodeB5 which is lower than the reference mid-voltage Vcm. That is, the comparison output data Cout<0:6> inputted to the decoder 150 may have a logic level combination of '0000111', and the decoder 150 may output binary output data having a logic level combination of '011'. In such a case, an output datum of the fourth comparator 144 may change from a logic "high(1)" level into a logic "low(0)" level, and the flag signal may be generated to have a logic "low(0)" level without any further operation. Thus, the mismatch correction logic circuit 160 may add the binary data '101' corresponding to the current "2×Iu+Iu" and the binary data '0' of the flag signal to the data having 9 bits (including an MSB) comprised of the first binary output data, the third binary output data, and the fifth binary output data. That is, the mismatch correction logic circuit 160 may add the binary data '101' corresponding to the current "2×Iu+Iu" and the flag binary data '0' to the data '110111111', thereby generating final digital output data having a logic level combination of '111000010'.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:
1. An analog-to-digital converter comprising:
a current driving circuit including an additive current driving circuit configured for increasing a voltage level of an input node and an output node of the current driving circuit, and including a subtractive current driving circuit configured for decreasing a voltage level of the input node and the output node; and
a comparison circuit including a plurality of comparators, each of which being configured to compare a voltage level of the output node of the current driving circuit with a plurality of reference voltages to generate comparison output data,
wherein the each of the plurality of comparators includes:
a first input terminal configured for receiving a voltage of the output node of the current driving circuit; and
a second input terminal configured for receiving one of the plurality of reference voltages or a reference mid-voltage, and
wherein the comparison circuit is configured to output the comparison output data based on a comparison result of each of the voltages, respectively, received by the first and second input terminals of the comparators.

2. The analog-to-digital converter of claim 1, further comprising:
a decoder configured to decode the comparison output data of the comparison circuit to generate binary data.

3. The analog-to-digital converter of claim 1, further comprising:
a sampling switch coupled between an input terminal, configured for receiving an input voltage, and the input node of the current driving circuit; and
a sampling capacitor coupled between the input node and a ground voltage.

4. The analog-to-digital converter of claim 1,
wherein the additive current driving circuit includes a plurality of additive current steering sources which are coupled in parallel between a power supply terminal and the output node to supply a current to the output node and a plurality of additive switches which are coupled between the output node and the plurality of additive current steering sources; and
wherein the subtractive current driving circuit includes a plurality of subtractive current steering sources which are coupled in parallel between the output node and a ground voltage terminal to supply a current to the ground voltage terminal and a plurality of subtractive switches which are coupled between the ground voltage terminal and the plurality of subtractive current steering sources.

5. The analog-to-digital converter of claim 4, wherein each of the additive current steering sources and the subtractive current steering sources are configured to generate a weighted current.

6. The analog-to-digital converter of claim 4,
wherein the additive current steering sources include:
a first additive current steering source configured to generate a current having an amount of "$2^8 \times lu$";
a second additive current steering source configured to generate a current having an amount of "$2^7 \times lu$";
a third additive current steering source configured to generate a current having an amount of "$2^6 \times lu$";
a fourth additive current steering source configured to generate a current having an amount of "$2^5 \times lu$";
a fifth additive current steering source configured to generate a current having an amount of "$2^4 \times lu$";
a sixth additive current steering source configured to generate a current having an amount of "$2^3 \times lu$";
a seventh additive current steering source configured to generate a current having an amount of "$2^2 \times lu$";
an eighth additive current steering source configured to generate a current having an amount of "$2 \times lu$"; and a ninth additive current steering source configured to generate a current having an amount of "1u" (where, "1u" denotes a unit current), and wherein the subtractive current steering sources include:
a first subtractive current steering source configured to generate a current having an amount of "$2^8 \times 1u$";
a second subtractive current steering source configured to generate a current having an amount of "$2^7 \times 1u$";
a third subtractive current steering source configured to generate a current having an amount of "$2^6 \times 1u$";
a fourth subtractive current steering source configured to generate a current having an amount of "$2^5 \times 1u$";
a fifth subtractive current steering source configured to generate a current having an amount of "$2^4 \times 1u$";
a sixth subtractive current steering source configured to generate a current having an amount of "$2^3 \times 1u$";
a seventh subtractive current steering source configured to generate a current having an amount of "$2^2 \times 1u$";
an eighth subtractive current steering source configured to generate a current having an amount of "$2 \times 1u$"; and
a ninth subtractive current steering source configured to generate a current having an amount of "1u".

7. The analog-to-digital converter of claim 1,
wherein the plurality of comparators include high-order comparators, low-order comparators, and a middle comparator disposed between a group of the high-order comparators and a group of the low-order comparators; and
wherein the group of the high-order comparators and the group of the low-order comparators are disposed to be substantially symmetrical with respect to the middle comparator.

8. The analog-to-digital converter of claim 7,
wherein each of the high-order comparators and the low-order comparators are configured to receive a voltage of the output node through the first input terminal thereof and receive one of the plurality of reference voltages through the second input terminal thereof; and
wherein the middle comparator is configured to receive a voltage of the output node through the first input terminal thereof and receive the reference mid-voltage through the second input terminal thereof.

9. The analog-to-digital converter of claim 8, wherein reference mid-voltage has a middle voltage level between a highest voltage level among the plurality of reference voltages and a lowest voltage level among the plurality of reference voltages.

10. The analog-to-digital converter of claim 1, wherein the plurality of comparators include:
a first comparator configured to receive a voltage of the output node through the first input terminal thereof and selectively receive one among a first reference voltage of a first group of reference voltages, a first reference voltage of a second group of reference voltages, and a first reference voltage of a third group of reference voltages through the second input terminal thereof;
a second comparator configured to receive a voltage of the output node through the first input terminal thereof and selectively receive one among a second reference voltage of the first group of reference voltages, a second reference voltage of the second group of reference voltages, and a second reference voltage of the third group of reference voltages through the second input terminal thereof;
a third comparator configured to receive a voltage of the output node through the first input terminal thereof and selectively receive one among a third reference voltage of the first group of reference voltages, a third reference voltage of the second group of reference voltages, and a third reference voltage of the third group of reference voltages through the second input terminal thereof;
a fourth comparator configured to receive a voltage of the output node through the first input terminal thereof and receive the reference mid-voltage through the second input terminal thereof;
a fifth comparator configured to receive a voltage of the output node through the first input terminal thereof and selectively receive one among a fourth reference voltage of the first group of reference voltages, a fourth reference voltage of the second group of reference voltages, and a fourth reference voltage of the third group of reference voltages through the second input terminal thereof;
a sixth comparator configured to receive a voltage of the output node through the first input terminal thereof and selectively receive one among a fifth reference voltage of the first group of reference voltages, a fifth reference voltage of the second group of reference voltages, and a fifth reference voltage of the third group of reference voltages through the second input terminal thereof; and
a seventh comparator configured to receive a voltage of the output node through the first input terminal thereof and selectively receive one among a sixth reference voltage of the first group of reference voltages, a sixth reference voltage of the second group of reference voltages, and a sixth reference voltage of the third group of reference voltages through the second input terminal thereof.

11. The analog-to-digital converter of claim 10,
wherein the first to third reference voltages, the reference mid-voltage and the fourth to sixth reference voltages included in the first group of reference voltages have voltage levels for equally dividing a voltage between a maximum reference voltage and a ground voltage into eight sections; and
wherein the first reference voltage of the first group of reference voltages has a highest voltage level among the first to sixth reference voltages of the first group of reference voltages and the reference mid-voltage, and the sixth reference voltage of the first group of reference voltages has a lowest voltage level among the first to sixth reference voltages of the first group of reference voltages and the reference mid-voltage.

12. The analog-to-digital converter of claim 11,
wherein the first to third reference voltages, the reference mid-voltage and the fourth to sixth reference voltages included in the second group of reference voltages have voltage levels for equally dividing a voltage between a first maximum reference voltage higher than the reference mid-voltage and a first minimum reference voltage lower than the reference mid-voltage into eight sections; and
wherein the first reference voltage of the second group of reference voltages has a highest voltage level among the first to sixth reference voltages of the second group of reference voltages and the reference mid-voltage, and the sixth reference voltage of the second group of reference voltages has a lowest voltage level among the first to sixth reference voltages of the second group of reference voltages and the reference mid-voltage.

13. The analog-to-digital converter of claim 12,
wherein the first maximum reference voltage has a mid-level between the third reference voltage and the reference mid-voltage included in the first group of reference voltages; and
wherein the first minimum reference voltage has a mid-level between the fourth reference voltage and the reference mid-voltage included in the first group of reference voltages.

14. The analog-to-digital converter of claim 13,
wherein the first to third reference voltages, the reference mid-voltage and the fourth to sixth reference voltages included in the third group of reference voltages have voltage levels for equally dividing a voltage between a second maximum reference voltage higher than the reference mid-voltage and a second minimum reference voltage lower than the reference mid-voltage into eight sections; and
wherein the first reference voltage of the third group of reference voltages has a highest voltage level among the first to sixth reference voltages of the third group of reference voltages and the reference mid-voltage, and the sixth reference voltage of the third group of reference voltages has a lowest voltage level among the first to sixth reference voltages of the third group of reference voltages and the reference mid-voltage.

15. The analog-to-digital converter of claim 14,
wherein the second maximum reference voltage has a mid-level between the third reference voltage and the reference mid-voltage included in the second group of reference voltages; and
wherein the second minimum reference voltage has a mid-level between the fourth reference voltage and the reference mid-voltage included in the second group of reference voltages.

16. The analog-to-digital converter of claim 15, further comprising:
a plurality of third switches coupled between the second input terminals of the first to third comparators as well as the fifth to seventh comparators and terminals of the first to sixth reference voltages of the first group of reference voltages, respectively;
a plurality of fourth switches coupled between the second input terminals of the first to third comparators as well as the fifth to seventh comparators and terminals of the first to sixth reference voltages of the second group of reference voltages, respectively; and
a plurality of fifth switches coupled between the second input terminals of the first to third comparators as well as the fifth to seventh comparators and terminals of the first to sixth reference voltages of the third group of reference voltages, respectively.

17. The analog-to-digital converter of claim 16,
wherein the comparison circuit performs a comparison operation with the third switches turned on during a first clock cycle at a first step that the output node has a first output node voltage which is equal to an input voltage applied to the input node and at a second step that the output node has a second output node voltage which is higher or lower than the reference mid-voltage;
wherein the comparison circuit performs a comparison operation with the fourth switches turned on during a second clock cycle at the second step that the output node has the second output node voltage and at a third step that the output node has a third output node voltage which is higher or lower than the reference mid-voltage; and
wherein the comparison circuit performs a comparison operation with the fifth switches turned on during a third clock cycle at the third step that the output node has the third output node voltage and at a fourth step that the output node has a fourth output node voltage which is higher or lower than the reference mid-voltage.

18. The analog-to-digital converter of claim 17, further comprising:
a decoder configured to decode the comparison output data of the comparison circuit to generate binary data and configured to output a portion of the binary data as digital output data.

19. The analog-to-digital converter of claim 18,
wherein the decoder combines binary data generated by the comparison operation of the comparison circuit at the first step during the first clock cycle, binary data generated by the comparison operation of the comparison circuit at the second step during the second clock cycle, and binary data generated by the comparison operation of the comparison circuit at the third step during the third clock cycle to generate data of a first bit or most significant bit MSB to a ninth bit of the digital output data; and
wherein the decoder generates a tenth bit or least significant bit LSB of the digital output data corresponding to binary data generated by the comparison operation of the comparison circuit at the fourth step during the third clock cycle.

20. The analog-to-digital converter of claim 19, wherein the decoder is configured to output a binary datum having a logic "low(0)" level as a flag signal for correcting a mismatch error after a converting operation is finished during the third clock cycle corresponding to a final clock cycle.

21. The analog-to-digital converter of claim 20, further comprising:
a mismatch correction logic circuit configured to perform a mismatch correction operation if the flag signal has a logic "low(0)" level.

22. The analog-to-digital converter of claim 1, further comprising:
an impedance device coupled between the output node of the current driving circuit and the current driving circuit, and configured to increase an output impedance value of the current driving circuit.

* * * * *